(12) United States Patent
Nagata

(10) Patent No.: US 11,594,629 B2
(45) Date of Patent: Feb. 28, 2023

(54) SEMICONDUCTOR DEVICE

(71) Applicant: ROHM CO., LTD., Kyoto (JP)

(72) Inventor: Masaki Nagata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/829,789

(22) Filed: Mar. 25, 2020

(65) Prior Publication Data

US 2020/0312997 A1    Oct. 1, 2020

(30) Foreign Application Priority Data

Mar. 29, 2019    (JP) .............................. JP2019-068577

(51) Int. Cl.
| | |
|---|---|
| *H01L 29/78* | (2006.01) |
| *H01L 29/423* | (2006.01) |
| *H01L 29/66* | (2006.01) |
| *H01L 29/06* | (2006.01) |

(52) U.S. Cl.
CPC ...... *H01L 29/7813* (2013.01); *H01L 29/0642* (2013.01); *H01L 29/4236* (2013.01); *H01L 29/66734* (2013.01)

(58) Field of Classification Search
CPC ............. H01L 29/7813; H01L 29/4236; H01L 29/66734; H01L 29/41766; H01L 29/66727

See application file for complete search history.

(56) References Cited

U.S. PATENT DOCUMENTS

| | | | | |
|---|---|---|---|---|
| 8,592,895 | B2 * | 11/2013 | Yilmaz ............. | H01L 21/26513 257/330 |
| 2011/0316074 | A1 * | 12/2011 | Oota ................... | H01L 29/7813 257/330 |
| 2013/0001679 | A1 * | 1/2013 | Omori ............... | H01L 29/66734 257/330 |

(Continued)

FOREIGN PATENT DOCUMENTS

JP        2006140239 A     6/2006

OTHER PUBLICATIONS

Hunsuk, Chung, "Analysis of Electrical Characteristics of Shielded Gate Power MOSFET According to Design and Process Parameters", Transactions on Electrical and Electronic Materials (2018) 19:245-248 (Year: 2018).*

(Continued)

*Primary Examiner* — Vincent Wall
(74) *Attorney, Agent, or Firm* — Hamre, Schumann, Mueller & Larson, P.C.

(57) ABSTRACT

There is provided a semiconductor device including: a semiconductor layer including a main surface; a plurality of trenches including a plurality of first trench portions and a plurality of second trench portions, respectively; an insulating layer formed in an inner wall of each of the second trench portions; a first electrode buried in each of the second trench portions with the insulating layer interposed between the first electrode and each of the second trench portions; a plurality of insulators buried in the first trench portions so as to cover the first electrode; a contact hole formed at a region between the plurality of first trench portions in the semiconductor layer so as to expose the plurality of insulators; and a second electrode buried in the contact hole.

15 Claims, 28 Drawing Sheets

(56) References Cited

U.S. PATENT DOCUMENTS

| | | | | |
|---|---|---|---|---|
| 2013/0256786 A1* | 10/2013 | Hsieh | ............... | H01L 29/0869 |
| | | | | 257/330 |
| 2015/0091084 A1* | 4/2015 | Lee | ............... | H01L 29/1095 |
| | | | | 257/334 |
| 2015/0108568 A1* | 4/2015 | Terrill | ............... | H01L 29/7813 |
| | | | | 257/331 |
| 2019/0081147 A1* | 3/2019 | West | ............... | H01L 29/42368 |

OTHER PUBLICATIONS

Sarkar et al., "Enhanced Shielded-gate Trench MOSFETs for Highfrequency, High-efficiency Computing Power Supply Applications", 2013 Twenty-Eighth Annual IEEE Applied Power Electronics Conference and Exposition (APEC), DOI:10.1109/APEC.2013.6520257 (Year: 2013).*

* cited by examiner

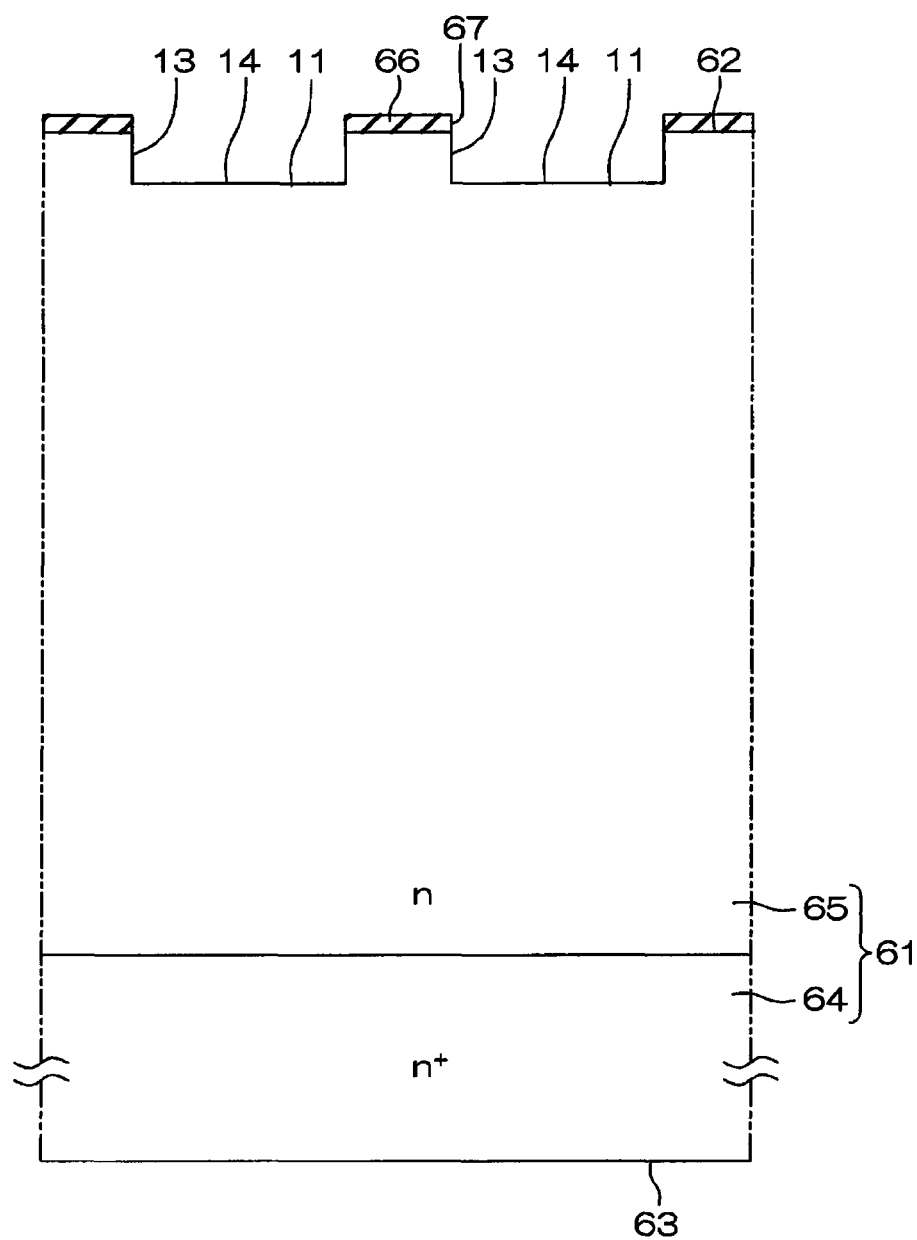

SEMICONDUCTOR DEVICE

CROSS-REFERENCE TO RELATED APPLICATION(S)

This application is based upon and claims the benefit of priority from Japanese Patent Application No. 2019-068577, filed on Mar. 29, 2019, the entire contents of which are incorporated herein by reference.

TECHNICAL FIELD

The present disclosure relates to a semiconductor device.

BACKGROUND

A related art discloses a semiconductor device having a trench contact structure. This semiconductor device includes a semiconductor substrate having a main surface. A plurality of trenches is formed at intervals in the main surface of the semiconductor substrate. A gate electrode is buried in each trench with an insulating layer interposed therebetween. An interlayer insulating layer is formed on the main surface of the semiconductor substrate. A contact trench (contact hole) is formed at a region between the plurality of trenches in the main surface of the semiconductor substrate. The contact trench penetrates through the interlayer insulating layer. A source electrode is buried in the contact trench.

When the contact hole penetrating through the interlayer insulating layer is formed at the region between the plurality of trenches, in a situation where a resist mask is used, the contact holes may be displaced due to an alignment error of the resist mask. In this case, the electrical characteristics of the semiconductor device may deteriorate due to the displacement of the contact holes.

SUMMARY

Some embodiments of the present disclosure provide a semiconductor device capable of suppressing displacement of a contact hole.

According to one embodiment of the present disclosure, there is provided a semiconductor device including: a semiconductor layer including a main surface; a plurality of trenches formed in the main surface at intervals from each other and including a plurality of first trench portions and a plurality of second trench portions, respectively, each of the first trench portions having a first width and formed in the main surface, and each of the second trench portions having a second width smaller than the first width and formed in a bottom wall of each of the first trench portions; an insulating layer formed in an inner wall of each of the second trench portions; a first electrode buried in each of the second trench portions with the insulating layer interposed between the first electrode and each of the second trench portions; a plurality of insulators buried in the first trench portions so as to cover the first electrode; a contact hole formed at a region between the plurality of first trench portions in the semiconductor layer so as to expose the plurality of insulators; and a second electrode buried in the contact hole.

According to another embodiment of the present disclosure, there is provided a semiconductor device including: a semiconductor layer including a main surface; a plurality of trenches formed in the main surface at intervals from each other and including a plurality of first trench portions and a plurality of second trench portions, respectively, each of the first trench portions having a first width and formed in the main surface, and each of the second trench portions having a second width smaller than the first width and formed in a bottom wall of each of the first trench portions; an insulating layer formed in an inner wall of each of the second trench portions; a bottom side electrode buried in a bottom wall side of each of the second trench portions with the insulating layer interposed between the bottom side electrode and the bottom wall side; an opening side electrode buried in an opening side of each of the second trench portions with the insulating layer interposed between the opening side electrode and the opening side; an intermediate insulating layer formed in each of the second trench portions so as to be interposed between the bottom side electrode and the opening side electrode; a plurality of insulators buried in the first trench portions so as to cover the opening side electrode; a contact hole formed at a region between the plurality of first trench portions in the semiconductor layer so as to expose the plurality of insulators; and an electrode buried in the contact hole.

BRIEF DESCRIPTION OF DRAWINGS

The accompanying drawings, which are incorporated in and constitute a part of the specification, illustrate embodiments of the present disclosure.

FIG. 6A is a cross-sectional view of a region corresponding to FIG. 1 for explaining an example of a method of manufacturing the semiconductor device shown in FIG. 1.

FIG. 6I is a cross-sectional view showing a step after FIG. 6H.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Some embodiments of the present disclosure will now be described in detail with reference to the accompanying drawings.

Figure 1:
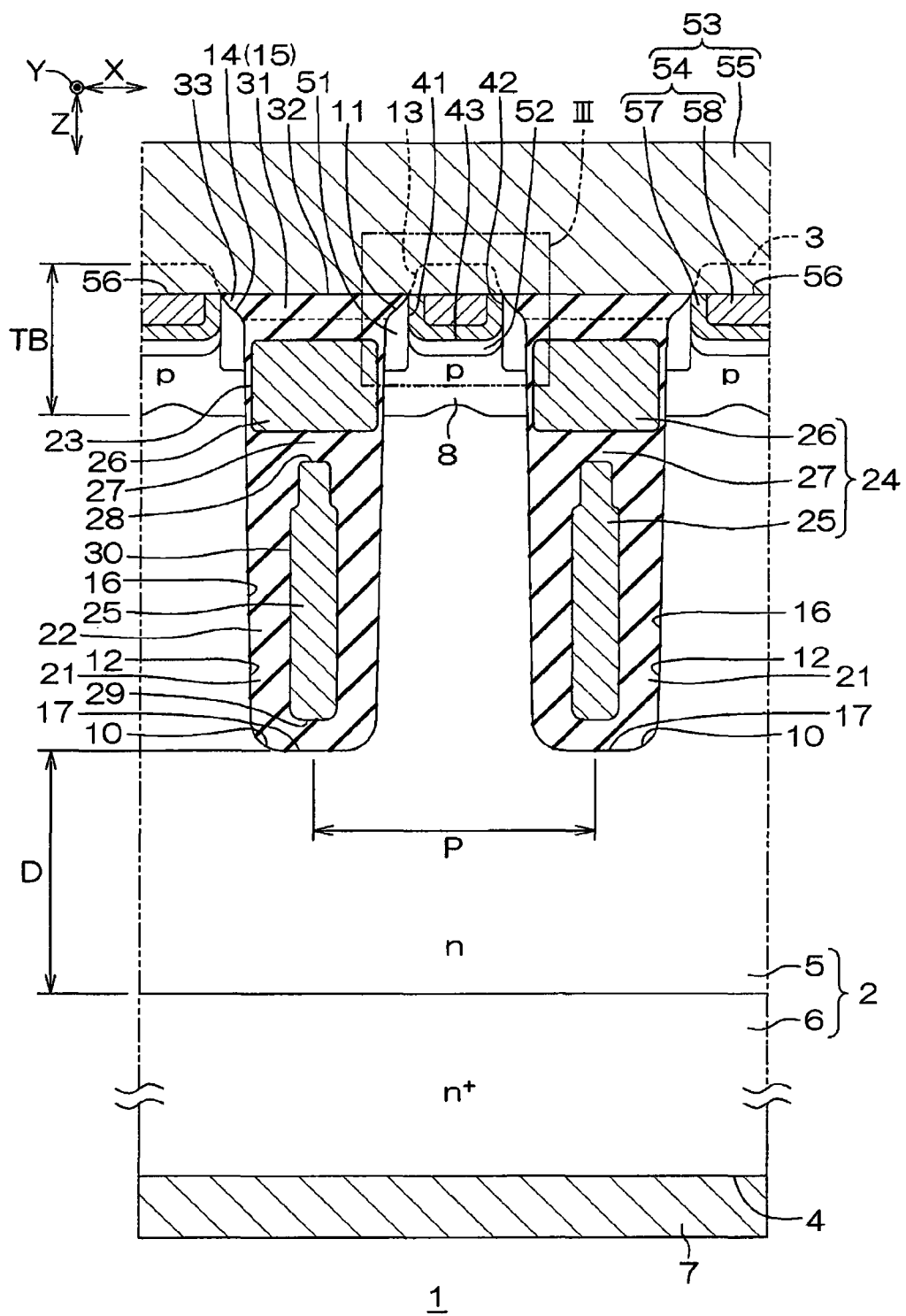
FIG. 1 is an enlarged cross-sectional view of a partial region of a semiconductor device according to a first embodiment of the present disclosure.
Figure 2:
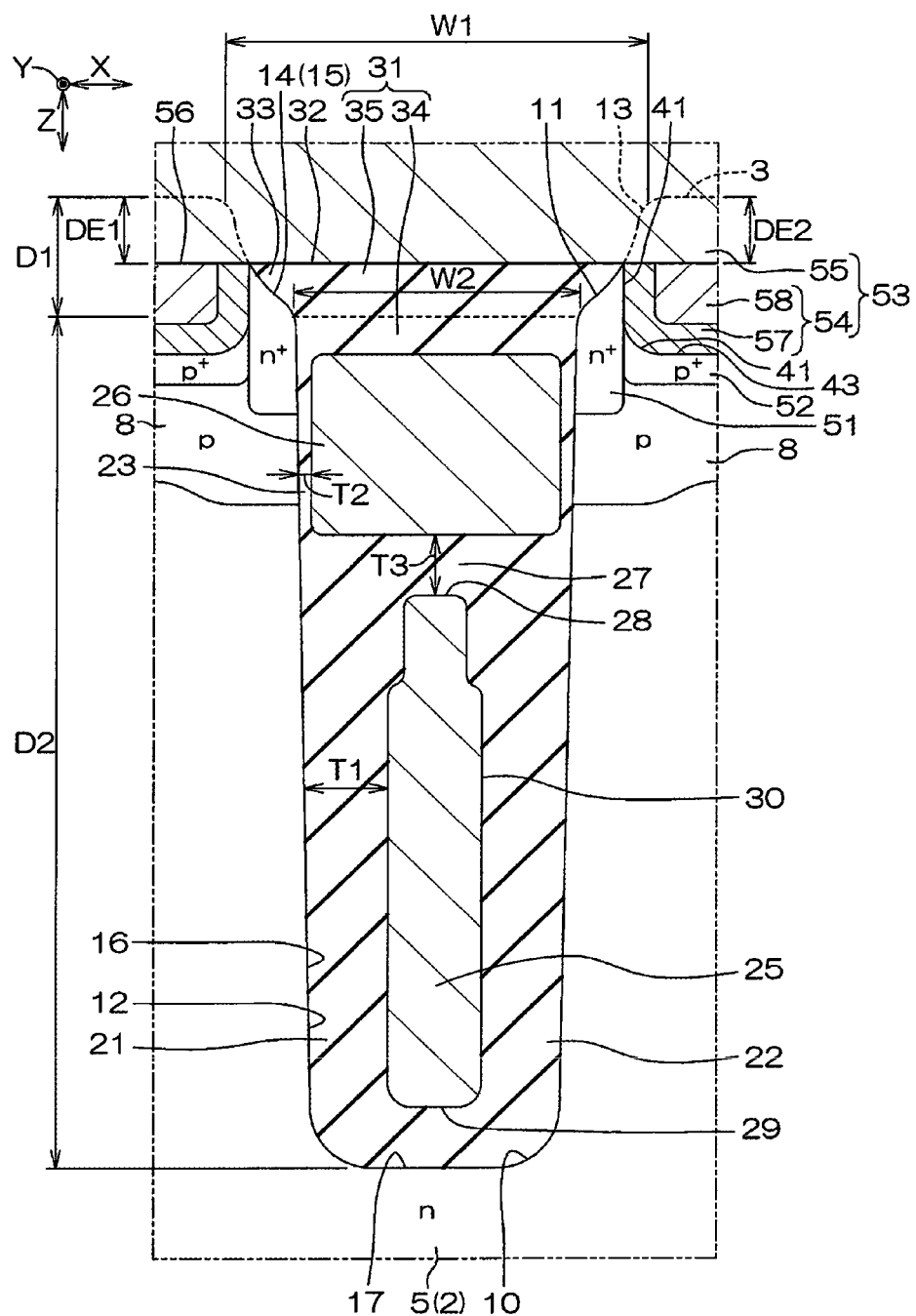
FIG. 2 is an enlarged cross-sectional view of one trench shown in FIG. 1.
Figure 3:
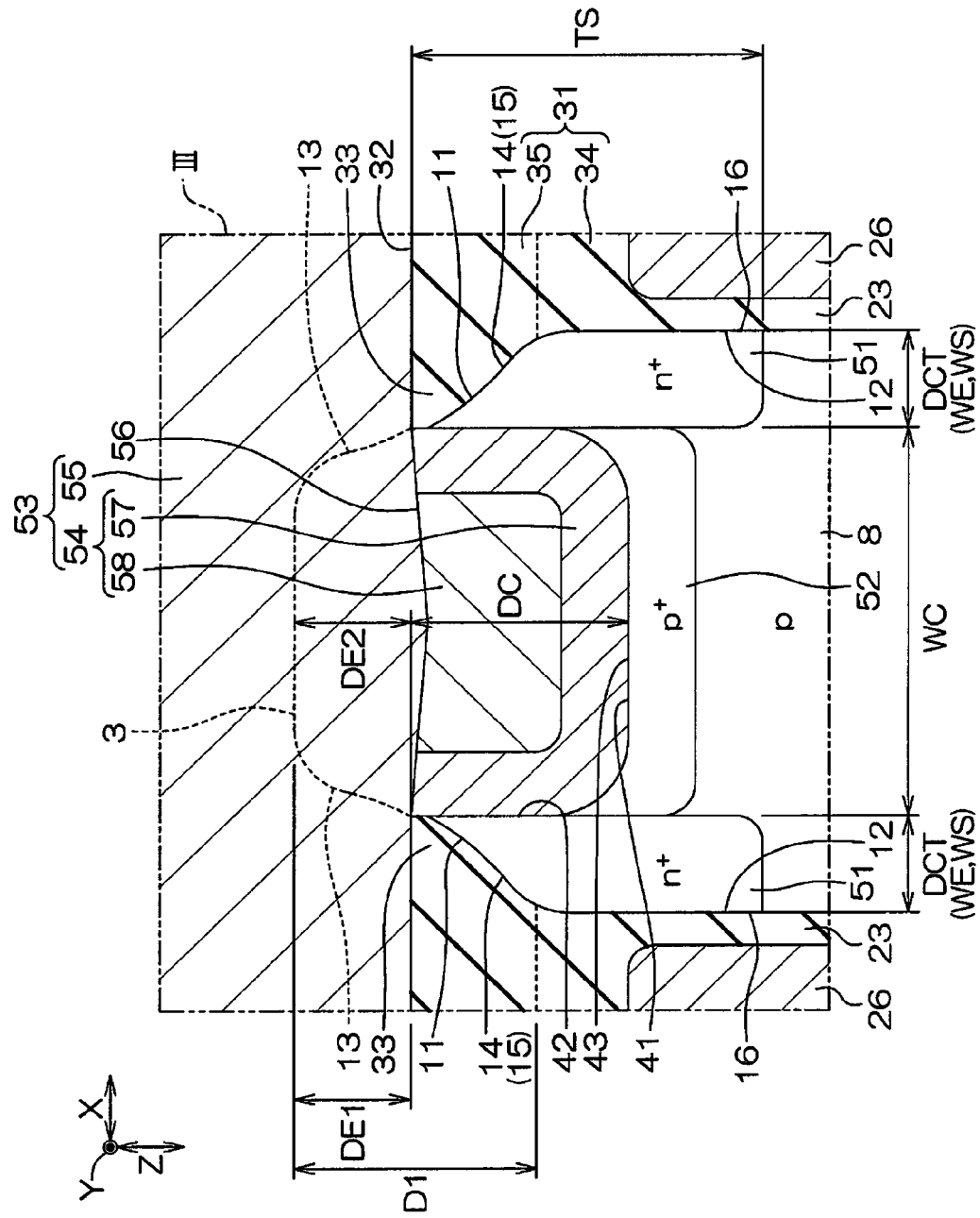
FIG. 3 is an enlarged view of a region III shown in FIG. 1.

FIG. 1 is an enlarged cross-sectional view of a partial region of a semiconductor device 1 according to a first embodiment of the present disclosure. FIG. 2 is an enlarged cross-sectional view of one trench shown in FIG. 1. FIG. 3 is an enlarged view of a region III shown in FIG. 1.

Referring to FIGS. 1 to 3, the semiconductor device 1 is a semiconductor switching device including a MISFET (Metal Insulator Semiconductor Field Effect Transistor) as an example of an insulated gate type transistor. The semiconductor device 1 includes a semiconductor layer 2. In this embodiment, the semiconductor layer 2 is made of Si (silicon). The semiconductor layer 2 may be formed in a rectangular parallelepiped shape.

The semiconductor layer 2 includes a first main surface 3 on one side and a second main surface 4 on the other side. In FIG. 1, the first main surface 3 is indicated by a broken line. The first main surface 3 and the second main surface 4 may be formed in a quadrangular shape in a plan view when viewed from the normal direction Z thereof (hereinafter simply referred to as a "plan view").

In this embodiment, the semiconductor layer 2 includes an n-type drift region 5 and an n+-type drain region 6. The drift region 5 is formed in a region on the first main surface 3 side. The drift region 5 forms the first main surface 3. The n-type impurity concentration of the drift region 5 may be $1\times10^{15}$ cm$^{-3}$ or more and $1\times10^{18}$ cm$^{-3}$ or less.

The drain region 6 is formed at a region on the second main surface 4 side with respect to the drift region 5. The drain region 6 forms the second main surface 4. The boundary between the drift region 5 and the drain region 6 extends parallel to the first main surface 3. The drain region 6 has an n-type impurity concentration exceeding the n-type impurity concentration of the drift region 5. The n-type impurity concentration of the drain region 6 may be $1\times10^{18}$ cm$^{-3}$ or more and $1\times10^{20}$ cm$^{-3}$ or less.

The drift region 5 may have a thickness of 1 μm or more and 25 μm or less. The thickness of the drift region 5 may be 1 μm or more and 10 μm or less, 10 μm or more and 15 μm or less, 15 μm or more and 20 μm or less, or 20 μm or more and 25 μm or less. The thickness of the drift region 5 is preferably 5 μm or more and 20 μm or less. In this embodiment, the thickness of the drift region 5 is about 10 μm.

The drain region 6 has a thickness exceeding the thickness of the drift region 5. The thickness of the drain region 6 may be 50 μm or more and 450 μm or less. The thickness of the drain region 6 may be 50 μm or more and 150 μm or less, 150 μm or more and 250 μm or less, 250 μm or more and 350 μm or less, or 350 μm or more and 450 μm or less.

In this embodiment, the drift region 5 is formed of an n-type epitaxial layer. In this embodiment, the drain region 6 is formed of an n+-type semiconductor substrate.

The semiconductor device 1 includes a drain electrode 7 formed on the second main surface 4. The drain electrode 7 is electrically connected to the drain region 6. The drain electrode 7 transmits a power supply voltage to the semiconductor layer 2.

The drain electrode 7 may include at least one selected from the group of a Ti layer, a Ni layer, an Au layer, an Ag layer, and an Al layer. The drain electrode 7 may have a single layer structure including a Ti layer, a Ni layer, an Au layer, an Ag layer, or an Al layer. The drain electrode 7 may have a laminated structure in which one or two or more of a Ti layer, a Ni layer, an Au layer, an Ag layer, and an Al layer are laminated in an arbitrary manner.

The semiconductor device 1 includes a p-type body region 8 formed in the surface layer of the first main surface 3. The body region 8 is formed at the surface layer of the drift region 5. The bottom of the body region 8 is formed at a region on the first main surface 3 side with respect to the bottom of the drift region 5. The p-type impurity concentration of the body region 8 may be $1\times10^{16}$ cm$^{-3}$ or more and $1\times10^{18}$ cm$^{-3}$ or less.

Thickness TB of the body region 8 may be 0.5 μm or more and 1.5 μm or less. The thickness TB is a thickness of the body region 8 in the normal direction Z with respect to the first main surface 3. The thickness TB may be 0.5 μm or more and 0.75 μm or less, 0.75 μm or more and 1 μm or less, 1 μm or more and 1.25 μm or less, or 1.25 μm or more and 1.5 μm or less.

The semiconductor device 1 includes a plurality of trenches 10 formed at the first main surface 3. The plurality of trenches 10 are formed at intervals along a first direction X. The plurality of trenches 10 are each formed in a strip shape extending along a second direction Y intersecting with the first direction X in a plan view. More specifically, the first direction X is perpendicular to the second direction Y. Thus, the plurality of trenches 10 are formed in a stripe shape extending along the second direction Y as a whole in a plan view.

The pitch P between the central portions of the plurality of trenches 10 adjacent to each other may be 0.5 μm or more and 5 μm or less. The pitch P may be 0.5 μm or more and 1 μm or less, 1 μm or more and 1.5 μm or less, 1.5 μm or more and 2 μm or less, 2 μm or more and 2.5 μm or less, 2.5 μm or more and 3 μm or less, 3 μm or more and 3.5 μm or less, 3.5 μm or more and 4 μm or less, or 4 μm or more and 4.5 μm or less. The pitch P is preferably 1 μm or more and 3 μm or less.

The plurality of trenches 10 penetrate through the body region 8 and reach the drift region 5. Thus, the body region 8 is formed at a region between the plurality of trenches 10 in the surface layer of the first main surface 3. The plurality of trenches 10 are each formed on the first main surface 3 side at intervals with respect to the bottom of the drift region 5.

The plurality of trenches 10 each have a double trench structure including a first trench portion 11 and a second trench portion 12. The first trench portion 11 is formed at the first main surface 3. More specifically, the first trench portion 11 is formed by digging into the first main surface 3 toward the second main surface 4. The first trench portion 11 is formed on the first main surface 3 side at an interval with respect to the bottom of the body region 8.

The first trench portion 11 includes a first side wall 13 and a first bottom wall 14. In the region of FIG. 1, since a portion of the first side wall 13 has disappeared, the disappeared portion of the first side wall 13 is indicated by a broken line. The first bottom wall 14 is formed on the first main surface 3 side at an interval with respect to the bottom of the body region 8. The first bottom wall 14 includes an inclined surface inclined with respect to the first main surface 3. More specifically, the first bottom wall 14 is formed in a curved shape from the inside of the first trench portion 11 toward the semiconductor layer 2.

The first trench portion 11 has a first width W1 and a first depth D1. The first width W1 is an opening width of the first trench portion 11 in the first direction X. The first depth D is a depth of the first trench portion 11 in the normal direction Z with respect to the first main surface 3.

The first width W1 may be 0.5 μm or more and 4.5 μm or less. The first width W1 may be 0.5 μm or more and 1 μm or less, 1 μm or more and 1.5 μm or less, 1.5 μm or more and 2 μm or less, 2 μm or more and 2.5 μm or less, 2.5 μm or more and 3 μm or less, 3 μm or more and 3.5 μm or less, 3.5 μm or more and 4 μm or less, or 4 μm or more and 4.5 μm or less. The first width W1 is preferably 1 μm or more and 2.5 μm or less.

The first depth D1 may be 0.4 μm or more and 1.6 μm or less. The first depth D1 may be 0.4 μm or more and 0.6 μm or less, 0.6 μm or more and 0.8 μm or less, 0.8 μm or more and 1 μm or less, 1 μm or more and 1.2 μm or less, 1.2 μm or more and 1.4 μm or less, or 1.4 μm or more and 1.6 μm or less. The first depth D1 is preferably 0.5 μm or more and 1 μm or less.

The second trench portion 12 is formed at the first bottom wall 14 of the first trench portion 11. More specifically, the second trench portion 12 is formed by digging into the first bottom wall 14 of the first trench portion 11 toward the second main surface 4. The second trench portion 12 penetrates through the body region 8 and reaches the drift region 5.

The second trench portion 12 is formed at the central portion of the first bottom wall 14 of the first trench portion 11 and exposes an edge portion 15 of the first bottom wall 14. As a result, the first trench portion 11 has a structure that protrudes from the second trench portion 12 in the lateral direction along the first main surface 3 by an amount corresponding to the edge portion 15 of the first bottom wall 14.

The width WE of the edge portion 15 may be 0.1 μm or more and 0.5 μm or less. The width WE is a width in a direction perpendicular to the direction in which the edge portion 15 extends in a plan view. The width WE may be 0.1 μm or more and 0.2 μm or less, 0.2 μm or more and 0.3 μm or less, 0.3 μm or more and 0.4 μm or less, or 0.4 μm or more and 0.5 μm or less. The width WE is preferably 0.15 μm or more and 0.3 μm or less.

The second trench portion 12 includes a second side wall 16 and a second bottom wall 17. The second side wall 16 is inclined with respect to the first bottom wall 14 of the first trench portion 11. More specifically, the second side wall 16 extends along the normal direction Z to expose the body region 8 and the drift region 5.

The absolute value of an angle formed between the second side wall 16 and the first main surface 3 in the semiconductor layer 2 may be 90° or more and 95° or less (for example, about) 91°. That is, the second trench portion 12 may be formed in a tapered shape that tapers from the first main surface 3 toward the second bottom wall 17 in a cross-sectional view.

The second bottom wall 17 is located in a region on the first main surface 3 side with respect to the bottom of the drift region 5. That is, the second bottom wall 17 exposes the drift region 5. The second bottom wall 17 is formed in a curved shape toward the bottom of the drift region 5.

The second trench portion 12 has a second width W2 and a second depth D2. The second width W2 is an opening width of the second trench portion 12 in the first direction X. The second depth D2 is a depth of the second trench portion 12 in the normal direction Z with respect to the first bottom wall 14 of the first trench portion 11.

The second width W2 is smaller than the first width W1 (W2<W1). The second width W2 may be 0.3 μm or more and 4 μm or less. The second width W2 may be 0.3 μm or more and 1 μm or less, 1 μm or more and 1.5 μm or less, 1.5 μm or more and 2 μm or less, 2 μm or more and 2.5 μm or less, 2.5 μm or more and 3 μm or less, 3 μm or more and 3.5 μm or less, or 3.5 μm or more and 4 μm or less. The second width W2 is preferably 0.8 μm or more and 2.3 μm or less.

The second depth D2 exceeds the first depth D1 (D1<D2). The second depth D2 may be 1 μm or more and 7 μm or less. The second depth D2 may be 1 μm or more and 2 μm or less, 2 μm or more and 3 μm or less, 3 μm or more and 4 μm or less, 4 μm or more and 5 μm or less, 5 μm or more and 6 μm or less, or 6 μm or more and 7 μm or less. The second depth D2 is preferably 1.5 μm or more and 6 μm or less.

The second bottom wall 17 is preferably formed at a distance D of at least 1 μm or more from the bottom of the drift region 5 in the normal direction Z. The distance D varies depending on the second depth D2 and the thickness of the drift region 5, but is preferably 1 μm or more and 5 μm or less.

The semiconductor device 1 includes an insulating layer 21 formed on the inner wall of each second trench portion 12. The insulating layer 21 is formed in a film shape along the inner wall of the second trench portion 12. The insulating layer 21 defines a U-shaped space depressed in a U-shape in the second trench portion 12.

The insulating layer 21 may include at least one selected from the group of a $SiO_2$ layer, a SiN layer, an $Al_2O_3$ layer, a $ZrO_2$ layer, and a $Ta_2O_3$ layer. The insulating layer 21 may have a single layer structure including a $SiO_2$ layer, a SiN layer, an $Al_2O_3$ layer, a $ZrO_2$ layer, or a $Ta_2O_3$ layer. The insulating layer 21 may have a laminated structure in which one or two or more of a $SiO_2$ layer, a SiN layer, an $Al_2O_3$ layer, a $ZrO_2$ layer, and a $Ta_2O_3$ layer are laminated in an arbitrary manner. In this embodiment, the insulating layer 21 includes a $SiO_2$ layer.

The insulating layer 21 includes a bottom side insulating layer 22 and an opening side insulating layer 23 formed in this order from the second bottom wall 17 side of the second trench portion 12 toward the first trench portion 11 side. The bottom side insulating layer 22 covers the inner wall on the second bottom wall 17 side. More specifically, the bottom side insulating layer 22 covers the inner wall on the second bottom wall 17 side with respect to the bottom of the body region 8. The bottom side insulating layer 22 defines a U-shaped space on the second bottom wall 17 side. A portion of the bottom side insulating layer 22 may be in contact with the body region 8.

The opening side insulating layer 23 covers the inner wall on the opening side of the second trench portion 12. More specifically, the opening side insulating layer 23 covers the second side wall 16 in a region on the opening side of the second trench portion 12 with respect to the bottom of the body region 8. The opening side insulating layer 23 is in contact with the body region 8. A portion of the opening side insulating layer 23 may be in contact with the drift region 5.

The bottom side insulating layer 22 has a first thickness T1. The opening side insulating layer 23 has a second thickness T2 smaller than the first thickness T1 (T2<T1). The second thickness T2 may be 1/100 or more and 1/10 or less of the first thickness T1. The first thickness T1 is a thickness along the normal direction of the inner wall of the second trench portion 12 in the bottom side insulating layer 22. The second thickness T2 is a thickness along the normal direction of the inner wall of the second trench portion 12 in the opening side insulating layer 23.

The ratio T1/W2 of the first thickness T1 of the bottom side insulating layer 22 to the second width W2 of the second trench portion 12 may be 0.1 or more and 0.4 or less. The ratio T1/W2 may be 0.1 or more and 0.2 or less, 0.2 or more and 0.3 or less, or 0.3 or more and 0.4 or less. The ratio T1/W2 is preferably 0.25 or more and 0.35 or less.

The first thickness T1 of the bottom side insulating layer 22 may be 0.1 μm or more and 1.5 μm or less. The first thickness T1 may be 0.1 μm or more and 0.25 μm or less, 0.25 μm or more and 0.5 μm or less, 0.5 μm or more and 0.75 μm or less, 0.75 μm or more and 1 μm or less, 1 μm or more and 1.25 μm or less, or 1.25 μm or more and 1.5 μm or less. The first thickness T1 is preferably 0.15 μm or more and 1 μm or less.

The second thickness T2 of the opening side insulating layer 23 may be 0.03 μm or more and 0.15 μm or less. The second thickness T2 may be 0.03 μm or more and 0.05 μm or less, 0.05 μm or more and 0.075 μm or less, 0.075 μm or more and 0.1 μm or less, 0.1 μm or more and 0.125 μm or less, or 0.125 μm or more and 0.15 μm or less. The second thickness T2 is preferably 0.05 μm or more and 0.1 μm or less.

The semiconductor device 1 includes a buried electrode 24 (first electrode) buried in each second trench portion 12 with the insulating layer 21 interposed therebetween. In this embodiment, the buried electrode 24 has an insulation-isolated split electrode structure including a bottom side electrode 25, an opening side electrode 26, and an intermediate insulating layer 27.

A reference voltage (for example, a ground voltage) may be applied to the bottom side electrode 25, and a gate voltage may be applied to the opening side electrode 26. In this case, the bottom side electrode 25 functions as a field electrode, while the opening side electrode 26 functions as a gate electrode. As a result, parasitic capacitance can be reduced so that a switching speed can be improved.

A gate voltage may be applied to the bottom side electrode 25 and the opening side electrode 26. In this case, the bottom side electrode 25 and the opening side electrode 26 function as a gate electrode. As a result, a voltage drop between the bottom side electrode 25 and the opening side electrode 26 can be suppressed, so that an undesired electric field concentration between the bottom side electrode 25 and the opening side electrode 26 can be suppressed. Further, since the on-resistance of the semiconductor layer 2 can be reduced, power consumption can be reduced.

The bottom side electrode 25 is buried on the second bottom wall 17 side with the insulating layer 21 interposed therebetween. More specifically, the bottom side electrode 25 is buried on the second bottom wall 17 side with the bottom side insulating layer 22 interposed therebetween. The bottom side electrode 25 faces the drift region 5 with the bottom side insulating layer 22 interposed therebetween. A part of the bottom side electrode 25 may face the body region 8 with the bottom side insulating layer 22 interposed therebetween.

The bottom side electrode 25 includes an upper end portion 28, a lower end portion 29, and a wall portion 30. The upper end portion 28 is located on the opening side of the second trench portion 12. The lower end portion 29 is located on the second bottom wall 17 side of the second trench portion 12. The wall portion 30 connects the upper end portion 28 and the lower end portion 29 and extends in a wall form along the second side wall 16 of the second trench portion 12.

The upper end portion 28 may be located closer to the opening side of the second trench portion 12 than the intermediate portion of the second trench portion 12 in the normal direction Z. The width of the upper end portion 28 in the first direction X is smaller than the width of the wall portion 30 in the first direction X. The bottom side electrode 25 includes a lead portion led out to the opening of the trench 10 in a region (not shown). The gate voltage or the reference voltage is applied to the lead portion of the bottom side electrode 25.

The lower end portion 29 is formed in a curved shape toward the second bottom wall 17 of the second trench portion 12. More specifically, the lower end portion 29 is formed so as to follow the bottom wall of the U-shaped space defined by the bottom side insulating layer 22, and is formed in a smooth curved shape toward the second bottom wall 17 of the second trench portion 12. According to such a structure, a local electric field concentration on the bottom side electrode 25 can be suppressed, so that a decrease in breakdown voltage can be suppressed.

The bottom side electrode 25 may contain at least one selected from the group of conductive polysilicon, tungsten, aluminum, copper, an aluminum alloy, and a copper alloy. In this embodiment, the bottom side electrode 25 contains conductive polysilicon. The bottom side electrode 25 may contain n-type polysilicon or p-type polysilicon.

The opening side electrode 26 is buried on the opening side of the second trench portion 12 with the insulating layer 21 interposed therebetween. More specifically, the opening side electrode 26 is buried on the opening side of the second trench portion 12 with the opening side insulating layer 23 interposed therebetween. The opening side electrode 26 faces the body region 8 with the opening side insulating layer 23 interposed therebetween. A portion of the opening side electrode 26 may face the drift region 5 with the opening side insulating layer 23 interposed therebetween.

In this embodiment, the opening side electrode 26 is formed on the second trench portion 12 side at an interval from the first bottom wall 14 of the first trench portion 11. As a result, the opening side electrode 26 defines a recess space between the opening side electrode 26 and the second side wall 16 in the opening side of the second trench portion 12.

The opening side electrode 26 may contain at least one selected from the group of conductive polysilicon, tungsten, aluminum, copper, an aluminum alloy, and a copper alloy. The opening side electrode 26 preferably contains the same kind of conductive material as the bottom side electrode 25. In this embodiment, the opening side electrode 26 contains conductive polysilicon. The opening side electrode 26 may contain n-type polysilicon or p-type polysilicon.

The intermediate insulating layer 27 is interposed between the bottom side electrode 25 and the opening side electrode 26 and electrically isolates the bottom side electrode 25 and the opening side electrode 26 from each other. More specifically, the intermediate insulating layer 27 covers the upper end portion 28 of the bottom side electrode 25 exposed from the bottom side insulating layer 22 in a region between the bottom side electrode 25 and the opening side electrode 26. The intermediate insulating layer 27 is continuous with the insulating layer 21 (the bottom side insulating layer 22 and the opening side insulating layer 23).

The intermediate insulating layer 27 has a third thickness T3 in the normal direction Z. The third thickness T3 exceeds the second thickness T2 of the opening side insulating layer 23 (T2<T3). The third thickness T3 may be 0.1 μm or more and 1.5 μm or less. The third thickness T3 may be 0.1 μm or more and 0.25 μm or less, 0.25 μm or more and 0.5 μm or less, 0.5 μm or more and 0.75 μm or less, 0.75 μm or more and 1 μm or less, 1 μm or more and 1.25 μm or less, or 1.25 μm or more and 1.5 μm or less. The third thickness T3 is preferably 0.2 μm or more and 0.5 μm or less.

The intermediate insulating layer 27 may include at least one selected from the group of a $SiO_2$ layer, a SiN layer, an $Al_2O_3$ layer, a $ZrO_2$ layer, and a $Ta_2O_3$ layer. The intermediate insulating layer 27 may have a single layer structure including a $SiO_2$ layer, a SiN layer, an $Al_2O_3$ layer, a $ZrO_2$ layer, or a $Ta_2O_3$ layer. The intermediate insulating layer 27 may have a laminated structure in which one or two or more of a $SiO_2$ layer, a SiN layer, an $Al_2O_3$ layer, a $ZrO_2$ layer, and a $Ta_2O_3$ layer are laminated in an arbitrary manner. The intermediate insulating layer 27 is preferably made of the same insulating material as the insulating layer 21. In this embodiment, the intermediate insulating layer 27 has a single layer structure composed of a $SiO_2$ layer.

The semiconductor device 1 includes an insulator 31 buried in each first trench portion 11 so as to cover the buried electrode 24. The insulator 31 has an exposed surface 32 exposed from the first trench portion 11. The exposed surface 32 is located on the first bottom wall 14 side of the first trench portion 11 with respect to the first main surface 3 of the semiconductor layer 2.

In the normal direction Z, the distance DE1 between the exposed surface 32 and the first main surface 3 is smaller than the first depth D1 of the first trench portion 11 (DE1<D1). The distance DE1 may be 0.1 μm or more and 1.2 μm or less. The distance DE1 may be 0.1 μm or more and 0.2 μm or less, 0.2 μm or more and 0.4 μm or less, 0.4 μm or more and 0.6 μm or less, 0.6 μm or more and 0.8 μm or less, 0.8 μm or more and 1 μm or less, or 1 μm or more and 1.2 μm or less.

The insulator 31 covers the edge portion 15 of the first bottom wall 14 in the first trench portion 11. As a result, the insulator 31 includes an extension portion 33 that protrudes laterally from the second trench portion 12 along the first main surface 3 in a cross-sectional view. The amount of protrusion of the extension portion 33 is adjusted by the width WE of the edge portion 15. The insulator 31 covers the buried electrode 24 (the opening side electrode 26) in the second trench portion 12. The insulator 31 is continuous with the insulating layer 21 in the second trench portion 12.

More specifically, the insulator 31 includes a first region 34 located in the second trench portion 12, and a second region 35 located in the first trench portion 11. The first region 34 covers the opening side electrode 26 in the second trench portion 12. The second region 35 covers the first region 34 in the first trench portion 11, and the first bottom wall 14 of the first trench portion 11. The extension portion 33 of the insulator 31 is formed by the second region 35.

The thickness of the second region 35 may be equal to or less than the thickness of the first region 34. The thickness of the second region 35 may be smaller than the thickness of the first region 34. The thickness of the second region 35 may be equal to or greater than the thickness of the first region 34. The thickness of the second region 35 may exceed the thickness of the first region 34.

The insulator 31 may include at least one selected from the group of a $SiO_2$ layer, a SiN layer, an $Al_2O_3$ layer, a $ZrO_2$ layer, and a $Ta_2O_3$ layer. The insulator 31 may have a single layer structure including a $SiO_2$ layer, a SiN layer, an $Al_2O_3$ layer, a $ZrO_2$ layer, or a $Ta_2O_3$ layer. The insulator 31 may have a laminated structure in which one or two or more of a $SiO_2$ layer, a SiN layer, an $Al_2O_3$ layer, a $ZrO_2$ layer, and a $Ta_2O_3$ layer are laminated in an arbitrary manner.

The insulator 31 is preferably made of the same insulating material as the insulating layer 21. In this embodiment, the insulator 31 has a laminated structure in which a plurality of $SiO_2$ layers are laminated. The first region 34 and the second region 35 of the insulator 31 are each formed by a $SiO_2$ layer.

The semiconductor device 1 includes a plurality of contact holes 41 formed respectively in regions between the plurality of first trench portions 11. The plurality of contact holes 41 are formed alternately with the plurality of first trench portions 11 along the first direction X in such a manner as to sandwich one first trench portion 11 therebetween. The plurality of contact holes 41 are each formed in a strip shape extending along the second direction Y in a plan view.

Thus, the plurality of contact holes 41 are formed in a stripe shape extending along the second direction Y as a whole in a plan view. Although not specifically shown, it is preferable that the length of each contact hole 41 in the second direction Y is shorter than the length of the first trench portion 11 in the second direction Y in a plan view.

Each contact hole 41 is formed by digging into the semiconductor layer 2 toward the second main surface 4 starting from the insulator 31 (exposed surface 32) adjacent in the first direction X. More specifically, the contact holes 41 are formed starting from the extension portions 33 of the insulators 31.

Each contact hole 41 exposes the plurality of insulators 31 adjacent to each other. Each contact hole 41 is arranged to be continuous with each of the plurality of first trench portions 11 adjacent to each other. More specifically, the contact holes 41 are continuous with the first bottom walls 14 of the plurality of first trench portions 11 adjacent to each other.

Each contact hole 41 is formed on the first main surface 3 side at an interval with respect to the bottom of the body region 8. Each contact hole 41 is formed at an interval from the second trench portion 12 in a plan view. As a result, a portion of the semiconductor layer 2 is interposed in a region between each contact hole 41 and the second trench portion 12.

Each contact hole 41 faces the insulator 31 in the first direction X. A portion of each contact hole 41 may face the opening side electrode 26 in the first direction X. Each contact hole 41 preferably faces only the insulator 31 in the first direction X.

That is, it is preferable that each contact hole 41 is formed on the first main surface 3 side at an interval with respect to the opening side electrode 26. In this case, since the contact hole 41 can be separated from the opening side electrode 26, a voltage drop generated between the opening side electrode 26 and the contact hole 41 can be suppressed. As a result, an undesired electric field concentration can be suppressed in a region between the contact hole 41 and the opening side electrode 26.

Each contact hole 41 includes a contact side wall 42 and a contact bottom wall 43. The contact side wall 42 extends along the normal direction Z. The contact side wall 42 faces the second side wall 16 of the second trench portion 12 via a portion of the semiconductor layer 2.

The contact side wall 42 may be inclined with respect to the first main surface 3. The absolute value of an angle formed between the contact side wall 42 and the first main surface 3 in the semiconductor layer 2 may be 90° or more and 95° or less (for example, about 91°). That is, the contact hole 41 may be formed in a tapered shape that tapers from the first main surface 3 toward the contact bottom wall 43.

The contact bottom wall 43 is located in a region on the first main surface 3 side with respect to the bottom of the body region 8. The contact bottom wall 43 is located in a region on the bottom side of the body region 8 with respect to the first bottom wall 14 of the first trench portion 11.

The contact hole 41 has a contact width WC and a contact depth DC. The contact width WC is a width of the contact hole 41 in the first direction X. The contact depth DC is a depth of the contact hole 41 in the normal direction Z with respect to the exposed surface 32 of the insulator 31.

The contact width WC is preferably smaller than the first width W1 of the first trench portion 11 (WC<W1). The contact width WC is more preferably smaller than the second width W2 of the second trench portion 12 (WC<W2).

The contact width WC may be 0.1 µm or more and 1 µm or less. The contact width WC may be 0.1 µm or more and 0.2 µm or less, 0.2 µm or more and 0.4 µm or less, 0.4 µm or more and 0.6 µm or less, 0.6 µm or more and 0.8 µm or less, or 0.8 µm or more and 1 µm or less. The contact width WC is preferably 0.2 µm or more and 0.6 µm or less.

The contact depth DC may be equal to or greater than the first depth D1 of the first trench portion 11 (D1≤DC) or may be less than the first depth D1 of the first trench portion 11 (DC<D1). The contact depth DC is smaller than the thickness TB of the body region 8 (DC<TB).

The contact depth DC may be 0.1 µm or more and 1 µm or less. The contact depth DC may be 0.1 µm or more and 0.2 µm or less, 0.2 µm or more and 0.4 µm or less, 0.4 µm or more and 0.6 µm or less, 0.6 µm or more and 0.8 µm or less, or 0.8 µm or more and 1 µm or less. The contact depth DC is preferably 0.2 µm or more and 0.5 µm or less.

The distance DCT between each contact hole 41 and the second trench portion 12 may be 0.05 µm or more and 0.6 µm or less. The distance DCT may be 0.05 µm or more and 0.1 µm or less, 0.1 µm or more and 0.2 µm or less, 0.2 µm or more and 0.3 µm or less, 0.3 µm or more and 0.4 µm or less, 0.4 µm or more and 0.5 µm or less, or 0.5 µm or more and 0.6 µm or less. The distance DCT is preferably 0.1 µm or more and 0.3 µm or less.

The distance DCT is adjusted by the width WE of the edge portion 15 of the first bottom wall 14. The distance DCT is preferably equal to or shorter than the contact width WC (DCT≤WC). The distance DCT is more preferably shorter than the contact width WC (DCT<WC).

It is preferable that each contact hole 41 is formed with a displacement amount M of 15 nm or less (M≤15 nm). The displacement amount M is a displacement amount (absolute value) of the contact hole 41 in the first direction X when an intermediate portion between two adjacent second trench portions 12 is set as a reference (zero point).

The displacement amount M may be obtained by actual measurement. The displacement amount M may also be obtained by the expression |DCT1−DCT2|/2. "DCT1" is a distance DCT between the contact hole 41 and the second trench portion 12 on one side. "DCT2" is a distance DCT between the contact hole 41 and the second trench portion 12 on the other side. The smaller the difference between "DCT1" and "DCT2," the more the variation in the electrical characteristics with respect to a design value can be suppressed.

The semiconductor device 1 includes a plurality of n+-type source regions 51 (impurity regions) formed respectively in regions along the first bottom wall 14 (the edge portion 15) of the first trench portion 11 in the body region 8. Each source region 51 has an n-type impurity concentration that exceeds the n-type impurity concentration of the drift region 5. The n-type impurity concentration of the source region 51 may be $1 \times 10^{19}$ cm$^{-3}$ or more and $1 \times 10^{21}$ cm$^{-3}$ or less.

The plurality of source regions 51 are each formed in a strip shape extending along the plurality of first trench portions 11 in a plan view. Each source region 51 is formed in a strip shape extending from the first bottom wall 14 of the corresponding first trench portion 11 toward the bottom of the body region 8 in a cross-sectional view.

Each source region 51 covers the insulator 31 exposed from the corresponding first trench portion 11. Each source region 51 further crosses the insulator 31 along the normal direction Z and covers the opening side insulating layer 23 exposed from the corresponding second trench portion 12.

Thus, each source region 51 faces the corresponding opening side electrode 26 with the opening side insulating layer 23 interposed therebetween. The bottom of each source region 51 is located in a region on the first trench portion 11 side with respect to the bottom of the body region 8. Each source region 51 defines a channel region of the MISFET with the drift region 5 in the body region 8.

Each source region 51 is formed at a region between the corresponding second trench portion 12 and the contact hole 41. Each source region 51 covers the contact side wall 42. Each source region 51 exposes the contact bottom wall 43. Thus, each source region 51 covers the first bottom wall 14 of the first trench portion 11, the second side wall 16 of the second trench portion 12, and the contact side wall 42 of the contact hole 41.

Each source region 51 has a source width WS and a source thickness TS. The source width WS is a width of each source region 51 in the first direction X. The source thickness TS is a thickness of each source region 51 in the normal direction Z with respect to the exposed surface 32 of the insulator 31. The source width WS is adjusted by the width WE of the edge portion 15.

The source thickness TS is equal to or greater than the source width WS (WS≤TS). Thus, each source region 51 has one or more aspect ratios TS/WS. The aspect ratio TS/WS is the ratio of the source thickness TS to the source width WS. In this embodiment, the source thickness TS exceeds the source width WS (WS<TS). That is, the aspect ratio TS/WS exceeds 1.

The source width WS is preferably equal to or less than the contact width WC (WS≤WC). In this embodiment, the source width WS is smaller than the contact width WC (WS<WC). The source thickness TS is preferably equal to or greater than the contact depth DC (DC≤TS). In this embodiment, the source thickness TS exceeds the contact depth DC (DC<TS).

The source width WS may be 0.1 μm or more and 0.6 μm or less. The source width WS may be 0.1 μm or more and 0.2 μm or less, 0.2 μm or more and 0.3 μm or less, 0.3 μm or more and 0.4 μm or less, 0.4 μm or more and 0.5 μm or less, or 0.5 μm or more and 0.6 μm or less. The source width WS is preferably 0.15 μm or more and 0.3 μm or less.

The source thickness TS may be 0.1 μm or more and 1 μm or less. The source thickness TS may be 0.1 μm or more and 0.2 μm or less, 0.2 μm or more and 0.4 μm or less, 0.4 μm or more and 0.6 μm or less, 0.6 μm or more and 0.8 μm or less, or 0.8 μm or more and 1 μm or less. The source thickness TS is preferably 0.2 μm or more and 0.5 μm or less.

The semiconductor device 1 includes a plurality of p+-type contact regions 52 formed respectively in regions along the plurality of contact holes 41 in the body region 8. Each contact region 52 is formed along each contact bottom wall 43. Each contact region 52 has a p-type impurity concentration that exceeds the p-type impurity concentration of the body region 8. The p-type impurity concentration of each contact region 52 may be $1\times10^{19}$ cm$^{-3}$ or more and $1\times10^{21}$ cm$^{-3}$ or less.

Each contact region 52 covers the entire area of each contact bottom wall 43. Each contact region 52 extends parallel to the contact bottom wall 43 and is electrically connected to the plurality of source regions 51. Each contact region 52 may have a portion that covers the contact side wall 42 via a corner of the contact hole 41.

The bottom of each contact region 52 is located in a region on the contact bottom wall 43 side with respect to the bottom of the body region 8. More specifically, the bottom of each contact region 52 is located in a region on the contact bottom wall 43 side with respect to the bottom of the plurality of source regions 51.

The semiconductor device 1 includes a source electrode 53 (second electrode) formed on the first main surface 3. The source electrode 53 transmits a reference voltage (for example, a ground voltage) to the body region 8, the source region 51, and the contact region 52.

The source electrode 53 covers the plurality of trenches 10 (the insulators 31) and enters the plurality of contact holes 41. The source electrode 53 is electrically connected to the body region 8, the plurality of source regions 51, and the plurality of contact regions 52 in the plurality of contact holes 41.

The source electrode 53 includes a plurality of first electrode portions 54 and a second electrode portion 55. The plurality of first electrode portions 54 are located in the plurality of contact holes 41. The second electrode portion 55 is located outside the plurality of contact holes 41.

Each first electrode portion 54 is electrically connected to the plurality of source regions 51 and contact regions 52 in the corresponding contact hole 41. Each first electrode portion 54 is further electrically connected to the body region 8 via the contact region 52. Each first electrode portion 54 is in contact with the insulator 31 exposed from the contact side wall 42.

Each first electrode portion 54 includes an electrode surface 56 exposed from the contact hole 41. The electrode surface 56 is located on the contact bottom wall 43 side with respect to the first main surface 3. The electrode surface 56 is continuous with the exposed surface 32 of the insulator 31. The electrode surface 56 may be formed flush with the exposed surface 32 of the insulator 31. The electrode surface 56 may have a curved surface that is depressed toward the contact bottom wall 43 from a portion in contact with the plurality of insulators 31 as a starting point.

In the normal direction Z, the distance DE2 between the electrode surface 56 and the first main surface 3 is shorter than the first depth D1 of the first trench portion 11 (DE2<D1). The distance DE2 may be 0.1 μm or more and 1.4 μm or less. The distance DE2 may be 0.1 μm or more and 0.2 μm or less, 0.2 μm or more and 0.4 μm or less, 0.4 μm or more and 0.6 μm or less, 0.6 μm or more and 0.8 μm or less, 0.8 μm or more and 1 μm or less, 1 μm or more and 1.2 μm or less, or 1.2 μm or more and 1.4 μm or less.

In this embodiment, each first electrode portion 54 has a laminated structure in which a plurality of electrodes are laminated. In this embodiment, the first electrode portion 54 includes a first layer 57 and a second layer 58 laminated in this order from the inner wall of the contact hole 41.

The first layer 57 is formed in a film shape along the inner wall of the contact hole 41. The first layer 57 defines a recess space in the contact hole 41. The first layer 57 includes at least one selected from the group of a Ti (titanium) layer and a TiN (titanium nitride) layer.

The first layer 57 may have a laminated structure including a Ti layer and a TiN layer laminated in this order from the inner wall of the contact hole 41. The first layer 57 may have a single layer structure including a Ti layer or a TiN layer. The first layer 57 functions as a barrier layer for the second layer 58.

The second layer 58 is buried in the contact hole 41 with the first layer 57 interposed therebetween. More specifically, the second layer 58 is buried in the recess space defined by the first layer 57. The second layer 58 includes a W (tungsten) layer. The electrode surface 56 of each first electrode portion 54 is formed by the first layer 57 and the second layer 58.

The second electrode portion 55 covers the plurality of first electrode portions 54. The second electrode portion 55 is electrically connected to the body region 8, the plurality of source regions 51, and the plurality of contact regions 52 via the plurality of first electrode portions 54.

More specifically, the second electrode portion 55 covers the electrode surfaces 56 of the plurality of first electrode portions 54, and the exposed surfaces 32 of the plurality of insulators 31. As a result, in a region on the second main surface 4 side with respect to the first main surface 3, the second electrode portion 55 is in contact with the exposed surface 32 of the insulator 31 and, at the same time, is connected to the electrode surface 56 of the first electrode portion 54.

The second electrode portion 55 may include at least one selected from the group of a nickel layer, a palladium layer, an aluminum layer, a copper layer, an aluminum alloy layer, and a copper alloy layer. The second electrode portion 55 may have a single layer structure including a nickel layer, a palladium layer, an aluminum layer, a copper layer, an aluminum alloy layer, and a copper alloy layer. The second electrode portion 55 may have a laminated structure in which one or more of a nickel layer, a palladium layer, an aluminum layer, a copper layer, an aluminum alloy layer, and a copper alloy layer are laminated in an arbitrary manner.

Figure 4:
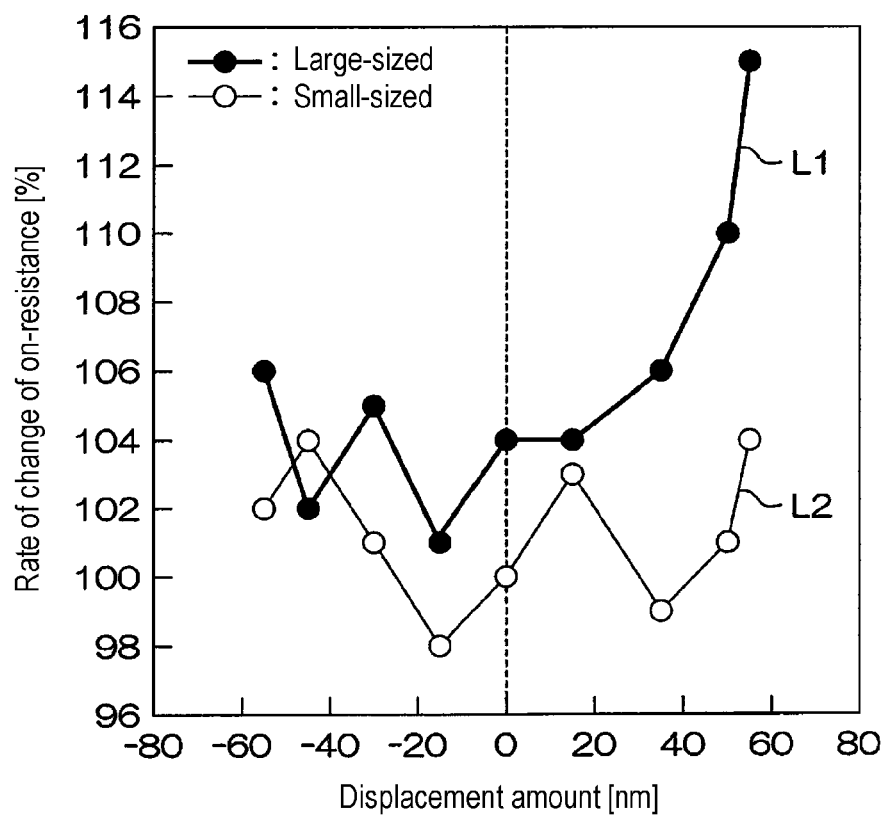
FIG. 4 is a graph showing a relationship between on-resistance and the amount of displacement of a contact hole, based on an actual measurement and examination.

FIG. 4 is a graph showing a relationship between on-resistance and the displacement amount M of the contact hole 41, based on an actual measurement and examination. In FIG. 4, the vertical axis represents the rate of change [%] of the on-resistance, and the horizontal axis represents the displacement amount M [nm] of the contact hole 41.

The on-resistance value indicates a rate of change based on a design value. In FIG. 4, the displacement amount M is indicated as positive and negative. The positive displacement amount M means that the contact hole 41 is close to the second trench portion 12 on one side. The negative displacement amount M means that the contact hole 41 is close to the second trench portion 12 on the other side.

FIG. 4 shows a first line L1 and a second line L2. The first line L1 indicates the on-resistance values of a large-sized contact hole 41 having a relatively large contact width WC. The contact width WC of the large-sized contact hole 41 exceeds 1 μm.

The second line L2 indicates the on-resistance values of a small-sized contact hole 41 having a relatively small contact width WC. The contact width WC of the small-sized contact hole 41 is 0.1 μm or more and 1 μm or less.

Referring to the first line L1, in the case of the large-sized contact hole 41, the maximum value of the rate of change of the on-resistance value exceeds 13% within the displacement range of ±60 nm. In the large-sized contact hole 41, the on-resistance value tends to increase with an increase in the displacement amount M.

On the other hand, referring to the second line L2, in the case of the small-sized contact hole 41, the maximum value of the rate of change of the on-resistance value was less than 10% within the displacement range of ±60 nm. The maximum value of the rate of change of the on-resistance value was more specifically 6%.

Figure 5:
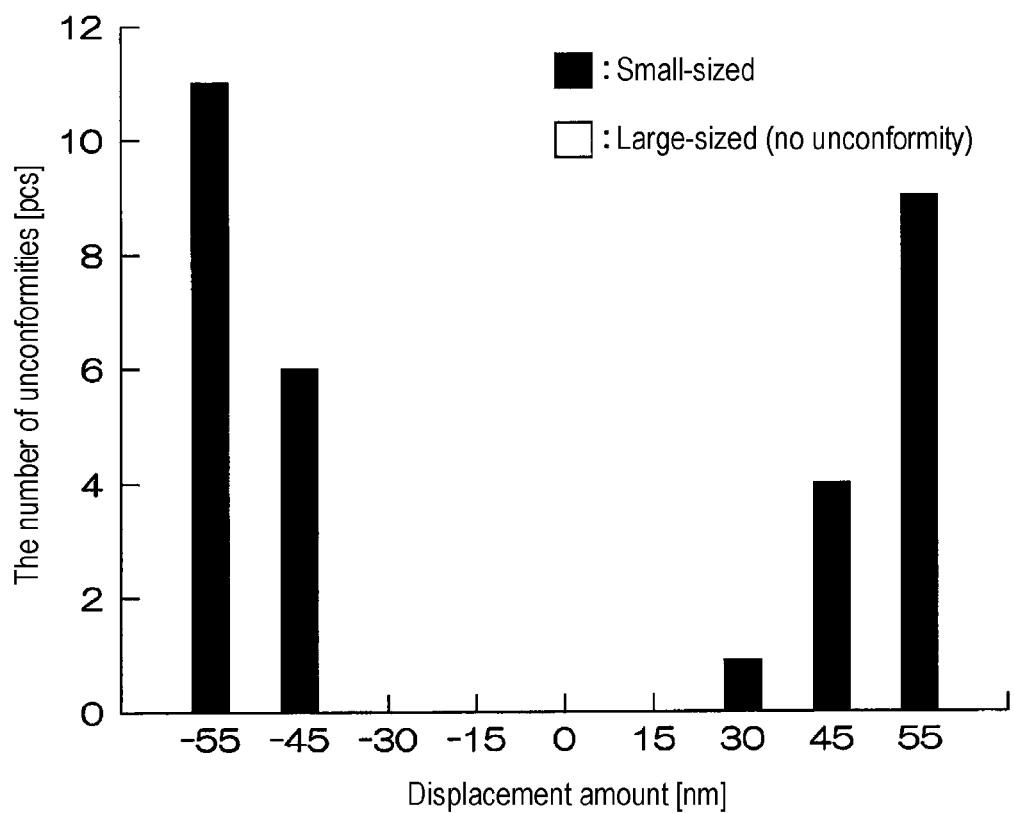
FIG. 5 is a graph showing a relationship between the number of non-conformities and the amount of displacement of a contact hole, based on an actual measurement and examination.

FIG. 5 is a graph showing the relationship between the number of non-conformities and the displacement amount M of the contact hole 41, based on an actual measurement and examination. In FIG. 5, the vertical axis represents the number of non-conformities [pcs], and the horizontal axis represents the displacement amount M [nm] of the contact hole 41. The non-conformity means that, when an inductive load is connected to the semiconductor device 1, the resistance to a counter electromotive force caused by the inductive load is less than a design value.

Here, for the semiconductor device 1 having the large-sized contact hole 41, twelve pieces having the displacement amounts M of −55 nm, −45 nm, −30 nm, −15 nm, 0 nm, 15 nm, 30 nm, 45 nm, and 55 nm are prepared and their respective resistances are then measured.

Further, for the semiconductor device 1 having the small-sized contact hole 41, twelve pieces having the displacement amounts M of −55 nm, −45 nm, −30 nm, −15 nm, 0 nm, 15 nm, 30 nm, 45 nm, and 55 nm are prepared and their respective resistances are then measured.

FIG. 5 shows the number of non-conformities when the large-sized contact hole 41 is formed and the number of non-conformities when the small-sized contact hole 41 is formed. In the case of the large-sized contact hole 41, the number of non-conformities is zero for any displacement amount M, and thus is not shown in the graph.

On the other hand, in the case of the small-sized contact hole 41, when the displacement amount M exceeds 15 nm, the number of non-conformities increased. Further, in the case of the small-sized contact hole 41, when the displacement amount M of the contact hole 41 is 15 nm or less, the number of non-conformities became zero.

As can be understood from the results of FIG. 4, it is preferable that the contact hole 41 has a relatively small contact width WC. As a result, an increase in the on-resistance value due to the displacement of the contact hole 41 can be suppressed. Further, the pitch P between the plurality of trenches 10 adjacent to each other can be reduced.

However, as can be understood from the results of FIG. 5, when the contact hole 41 having a relatively small contact width WC of 0.1 μm or more and 1 μm or less is formed, the allowable range of the displacement amount M is extremely narrow. In this case, it is necessary to form the contact hole 41 with the displacement amount M of 15 nm or less.

As described above, according to the semiconductor device 1, the contact hole 41 is formed using the plurality of insulators 31. More specifically, the contact hole 41 is formed in a self-aligned manner with respect to the plurality of insulators 31. The contact hole 41 is formed at a region between the plurality of first trench portions 11 in the semiconductor layer 2 so as to expose the plurality of insulators 31.

As a result, the formation region of the contact hole 41 can be limited to the region between the plurality of insulators 31. The region between the plurality of insulators 31 in the semiconductor layer 2 is not affected by an alignment error of a resist mask. As a result, the displacement of the contact hole 41 can be appropriately suppressed. Therefore, it is possible to suppress a decrease in electrical characteristics due to the displacement of the contact hole 41.

More specifically, the insulator 31 includes the extension portion 33 that covers the first bottom wall 14 (the edge portion 15) of the first trench portion 11. The contact hole 41 is formed starting from the extension portion 33 of the insulator 31. As a result, the arrangement of the contact hole 41 can be accurately adjusted by the extending portion 33 of the insulator 31.

For example, according to the semiconductor device 1, the contact hole 41 can be appropriately formed at a region between the plurality of trenches 10 with the displacement amount M of 15 nm or less. In this case, the pitch P between the plurality of trenches 10 is preferably 0.5 μm or more and 5 μm or less.

In addition, the contact width WC is preferably smaller than the first width W1 of the first trench portion 11 (WC<W1). Further, the contact width WC is preferably smaller than the second width W2 of the second trench portion 12 (WC<W2).

Further, the contact width WC is preferably 0.1 μm or more and 1 μm or less. In this case, the contact width WC is more preferably 0.2 μm or more and 0.6 μm or less. The distance DCT between each contact hole 41 and the second trench portion 12 (the width WE of the edge portion 15) is preferably equal to or less than the contact width WC (DCT≤WC). In this case, the distance DCT may be 0.05 μm or more and 0.6 μm or less. The distance DCT is preferably 0.1 μm or more and 0.3 μm or less.

Figure 6B:
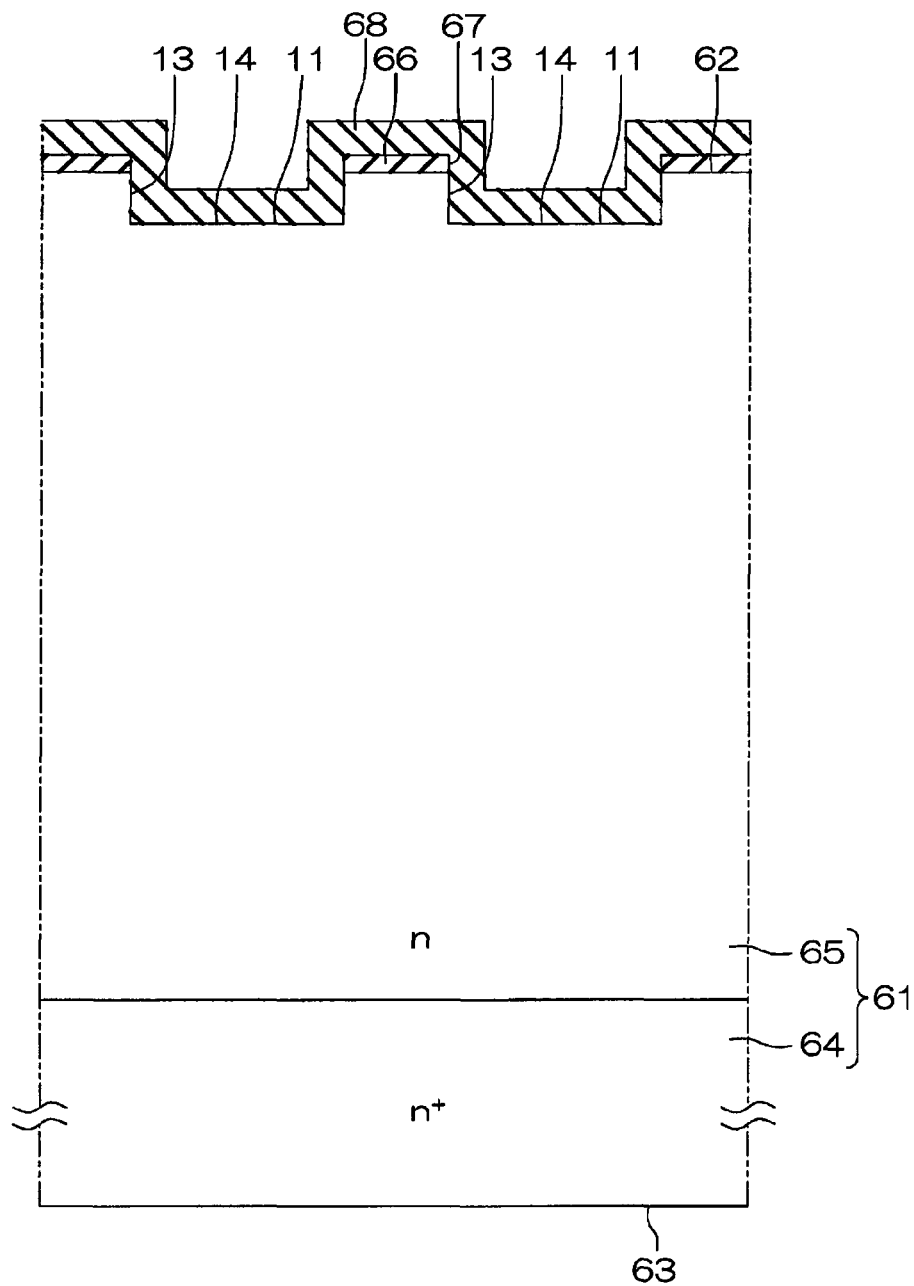
FIG. 6B is a cross-sectional view showing a step after FIG. 6A.
Figure 6C:
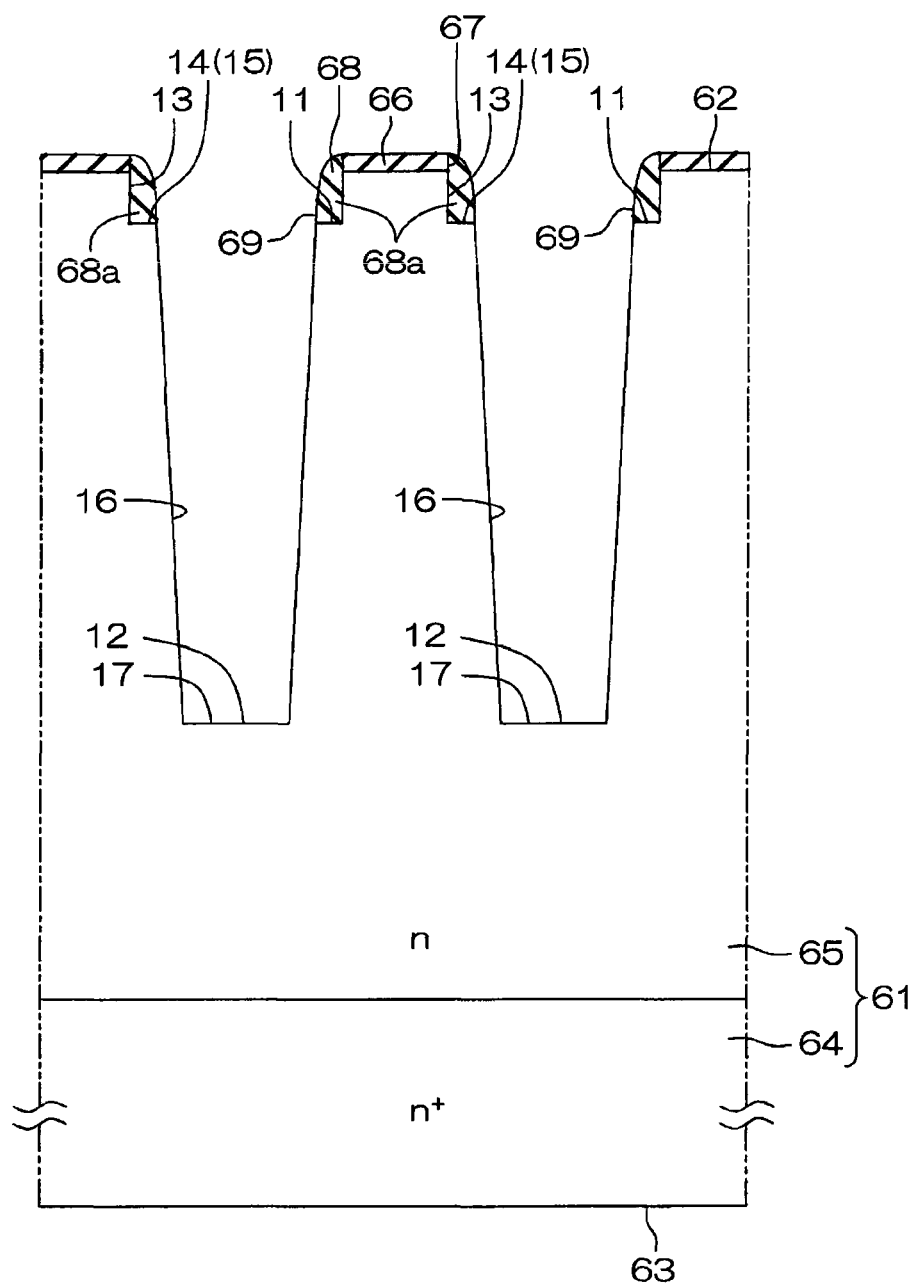
FIG. 6C is a cross-sectional view showing a step after FIG. 6B.
Figure 6D:
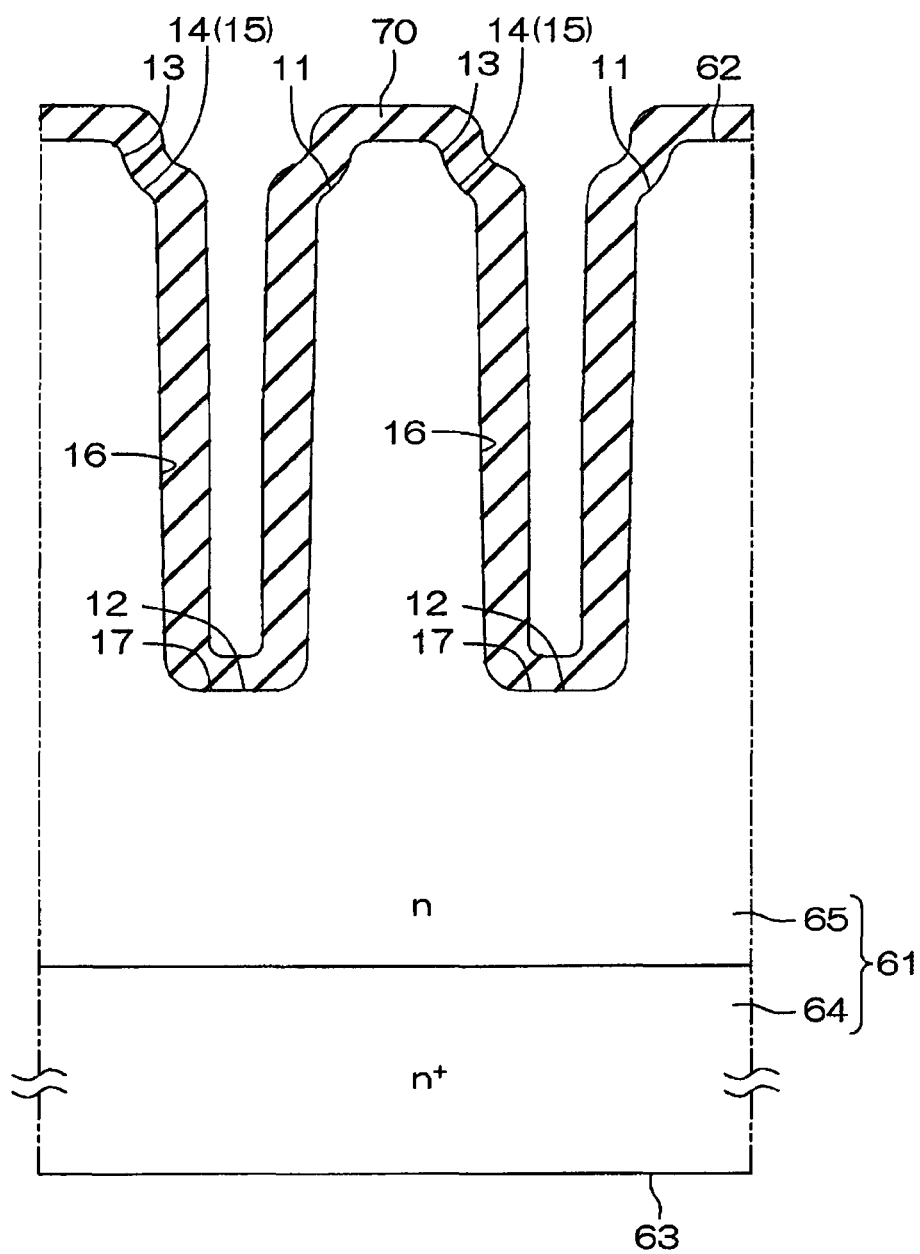
FIG. 6D is a cross-sectional view showing a step after FIG. 6C.
Figure 6E:
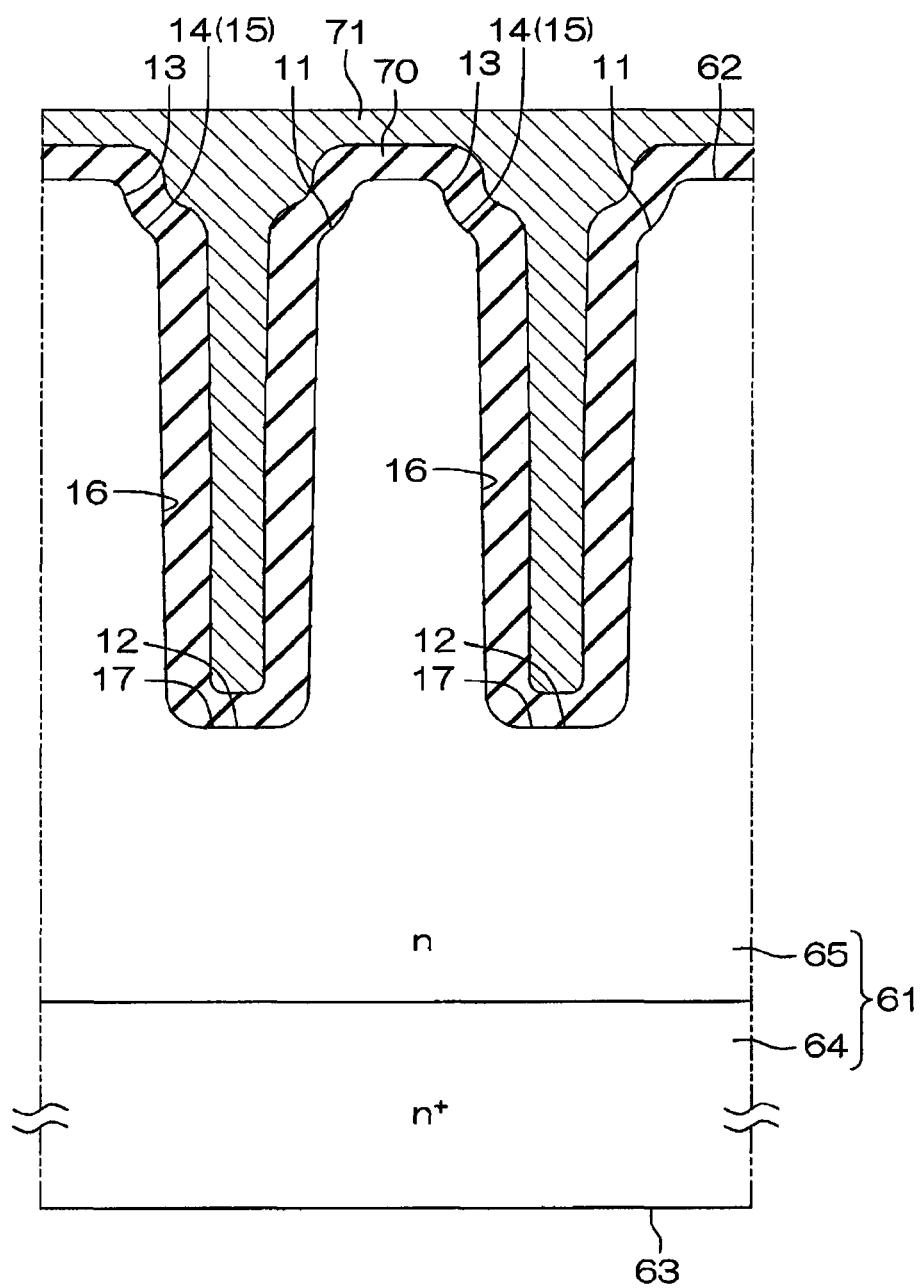
FIG. 6E is a cross-sectional view showing a step after FIG. 6D.
Figure 6F:
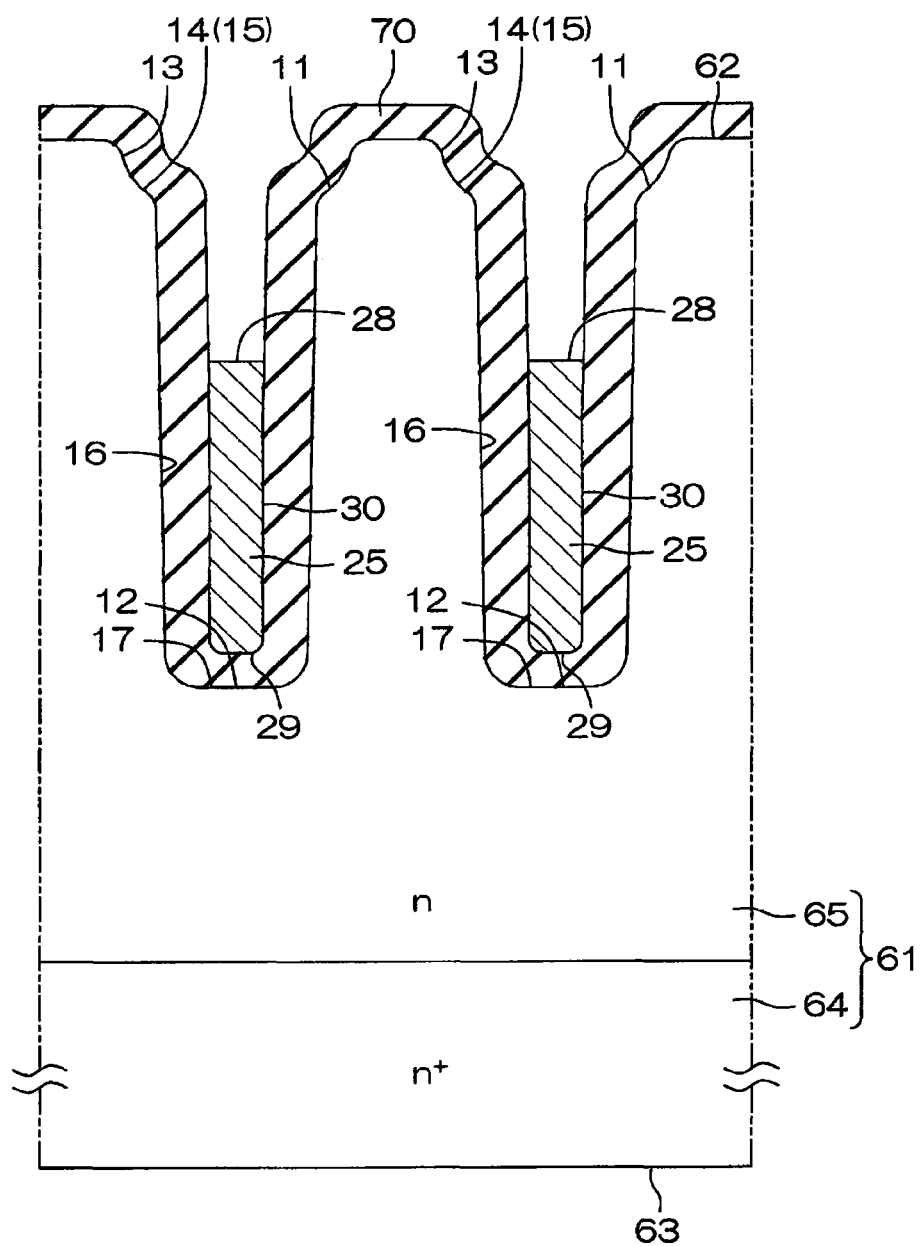
FIG. 6F is a cross-sectional view showing a step after FIG. 6E.
Figure 6G:
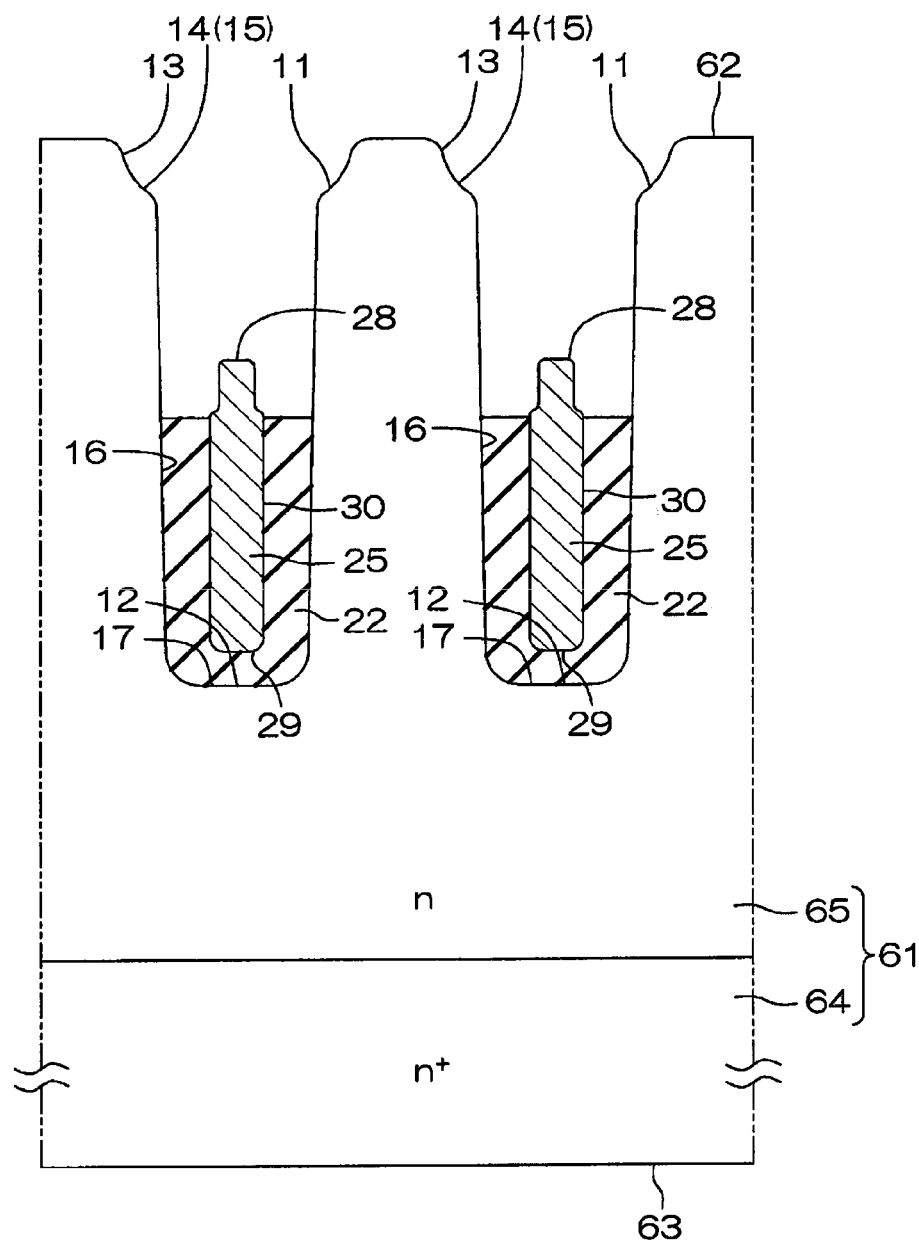
FIG. 6G is a cross-sectional view showing a step after FIG. 6F.
Figure 6H:
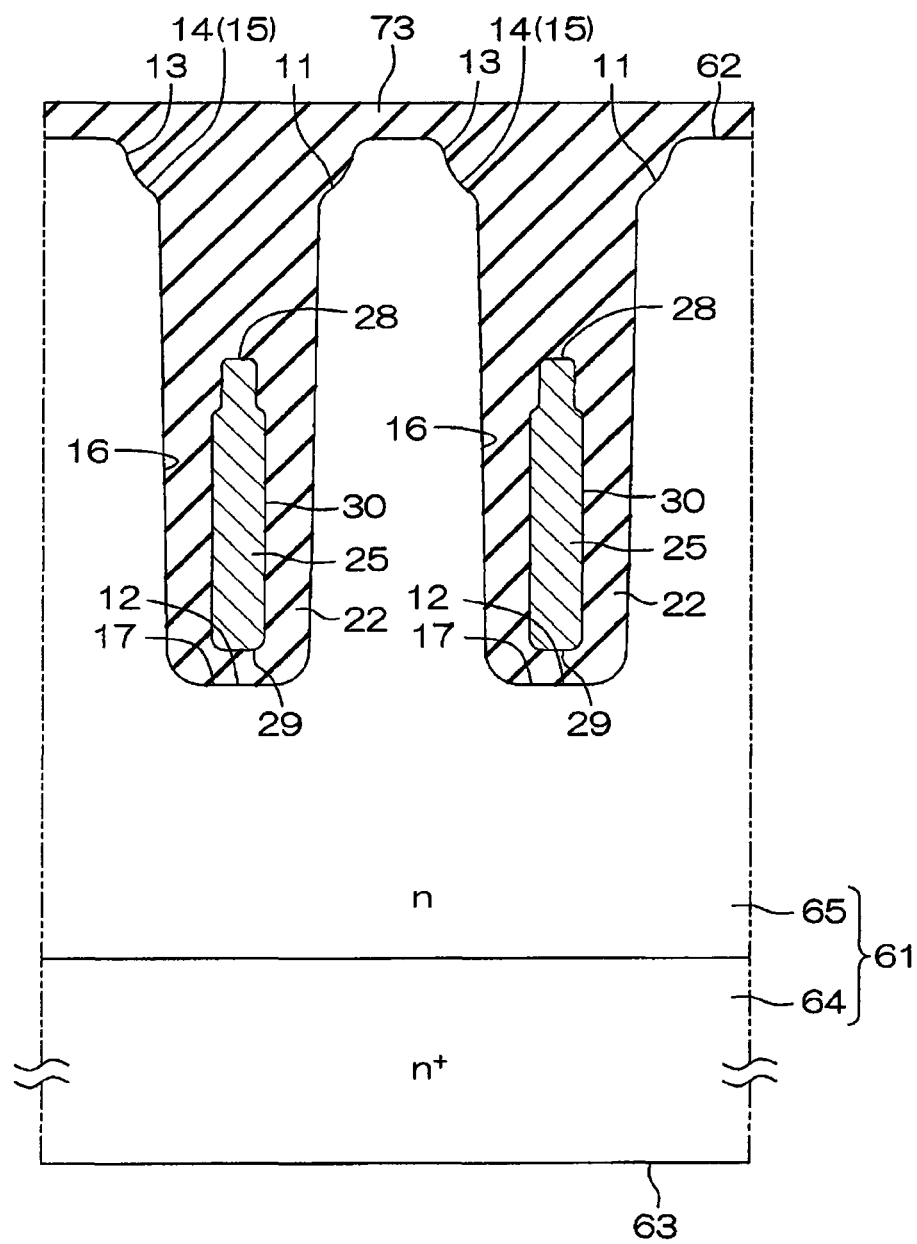
FIG. 6H is a cross-sectional view showing a step after FIG. 6G.
Figure 61:
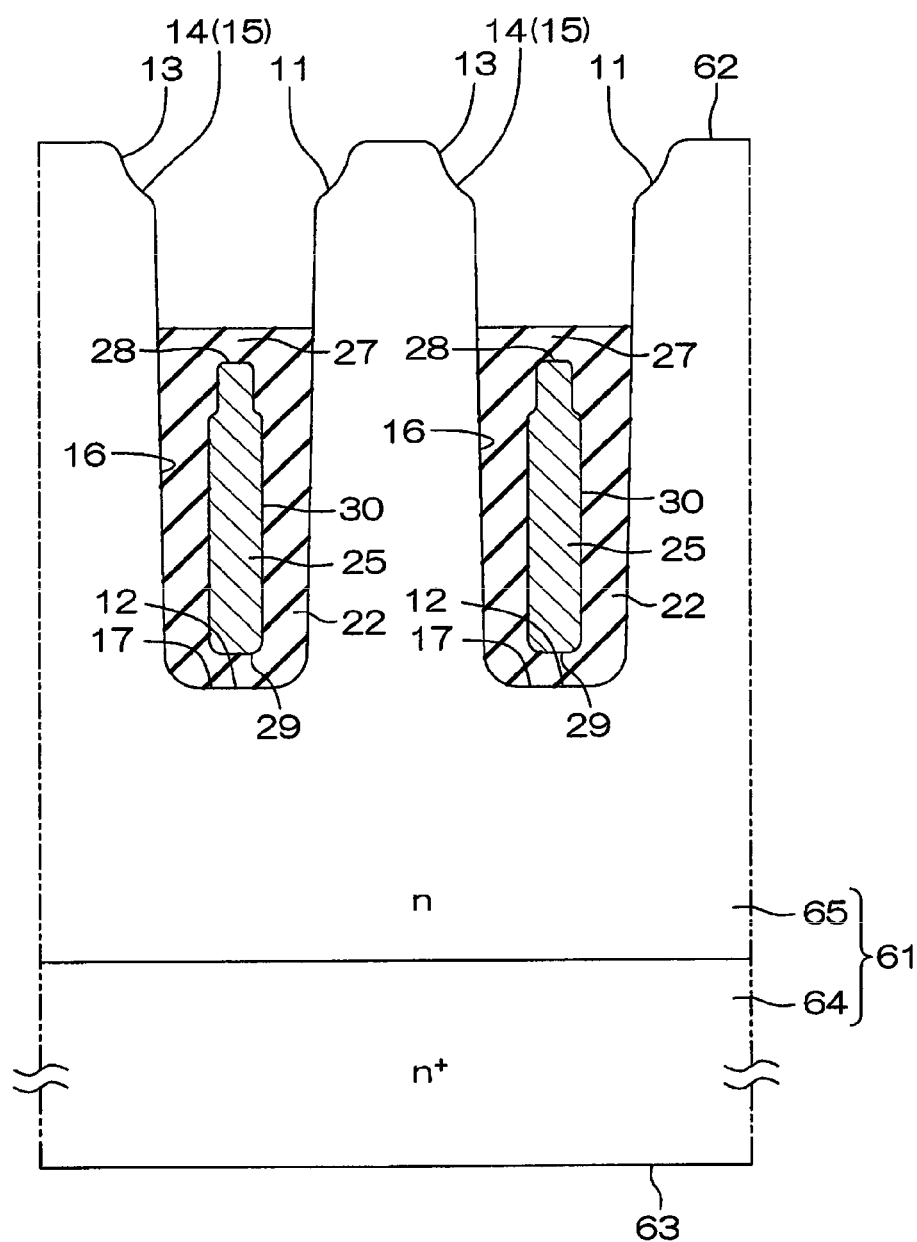
Figure 6J:
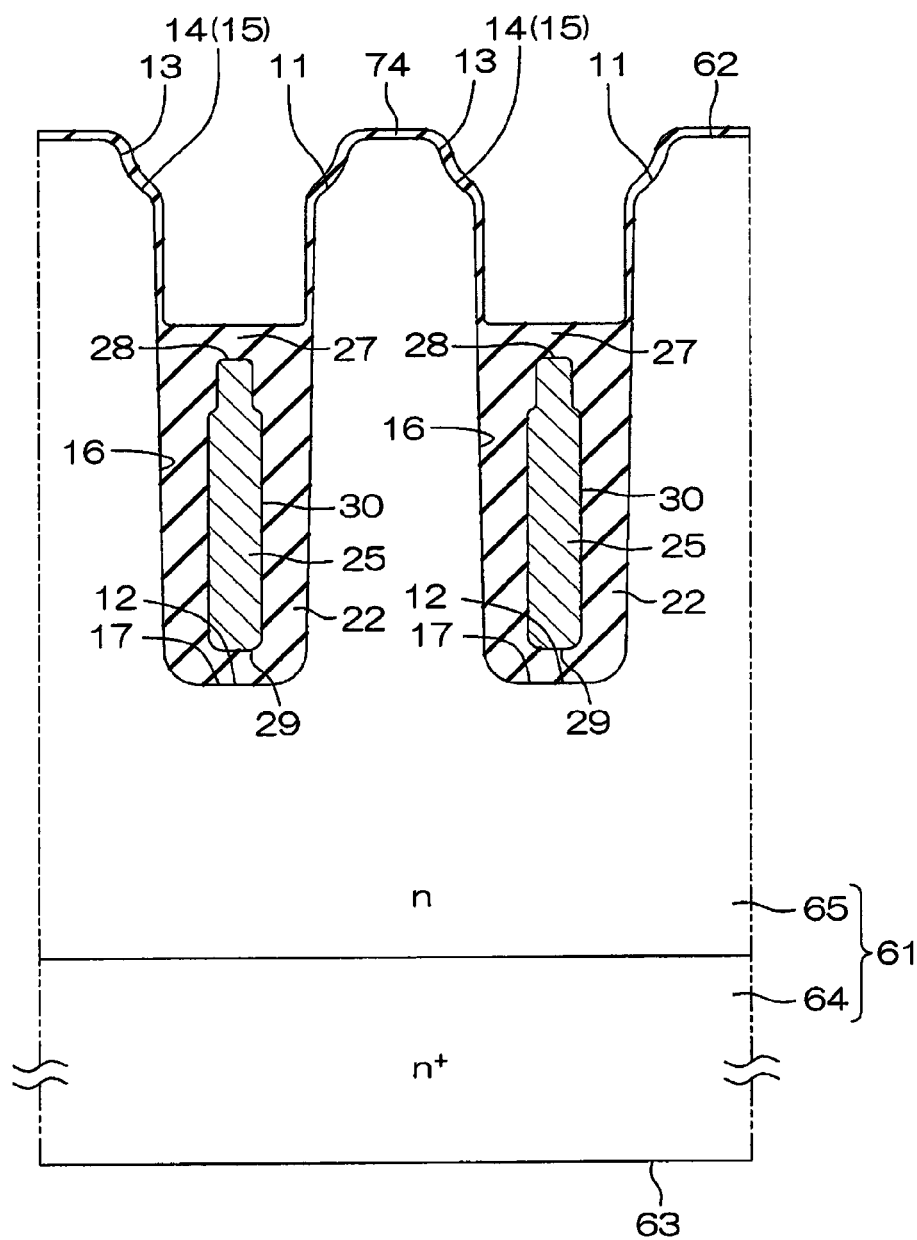
FIG. 6J is a cross-sectional view showing a step after FIG. 6I.
Figure 6K:
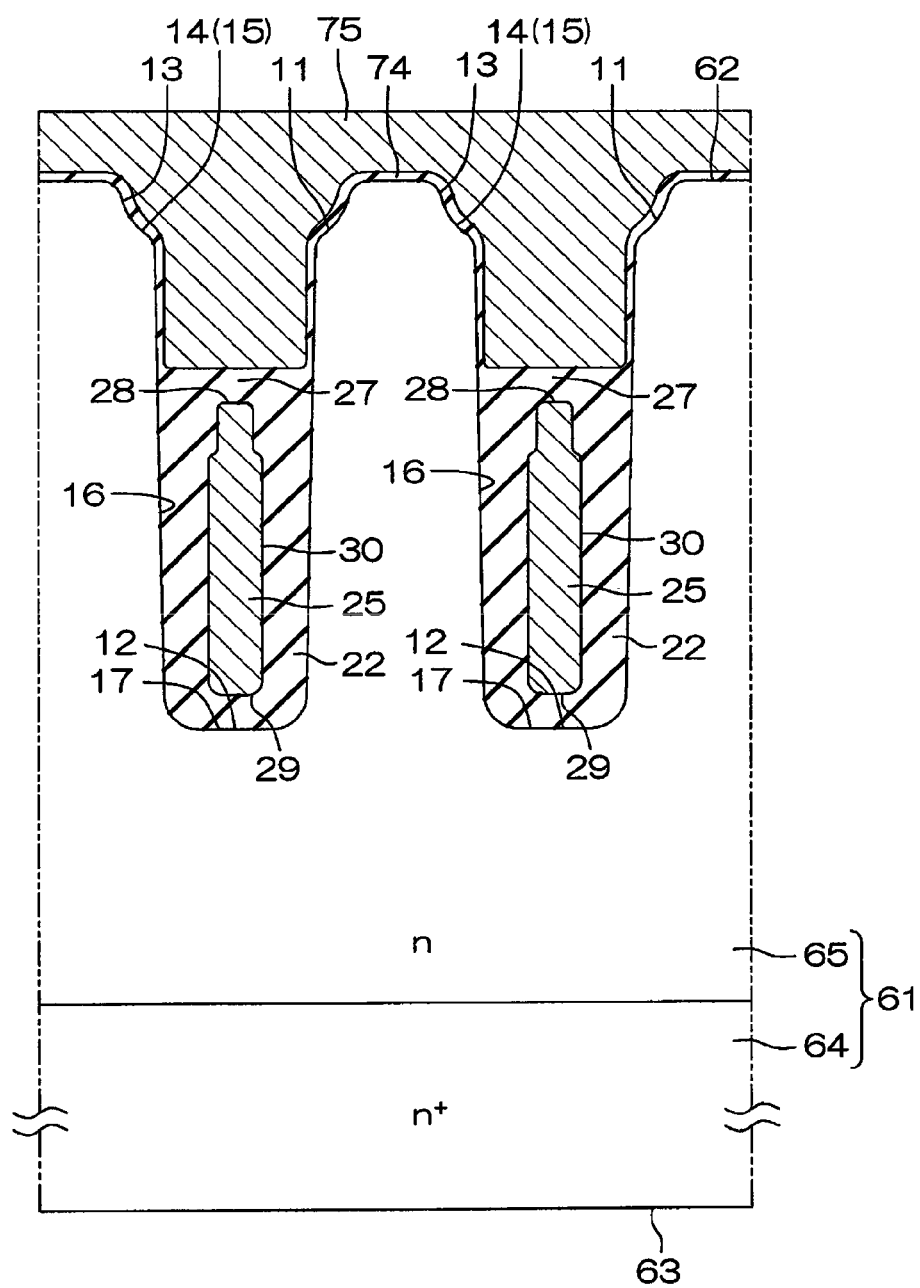
FIG. 6K is a cross-sectional view showing a step after FIG. 6J.
Figure 6L:
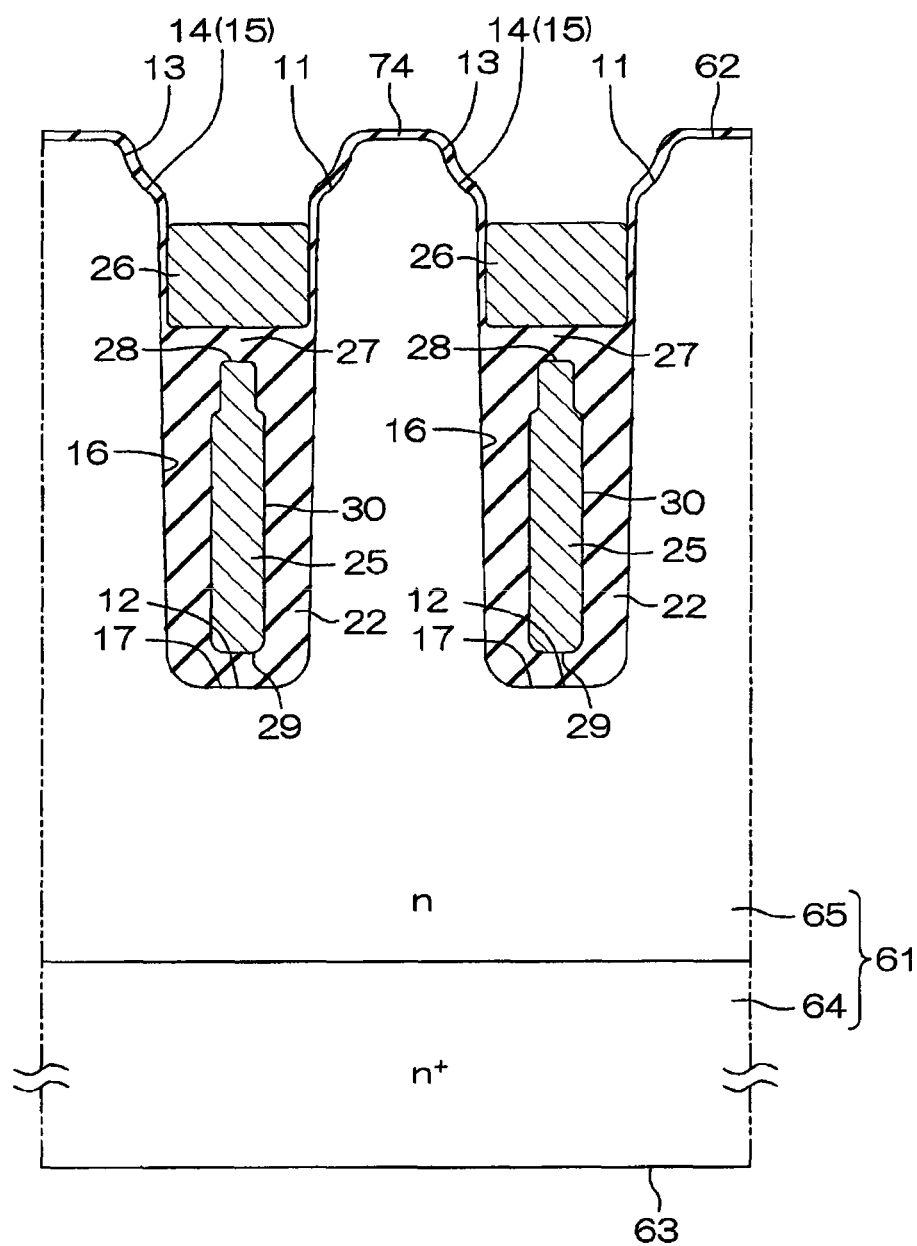
FIG. 6L is a cross-sectional view showing a step after FIG. 6K.
Figure 6M:
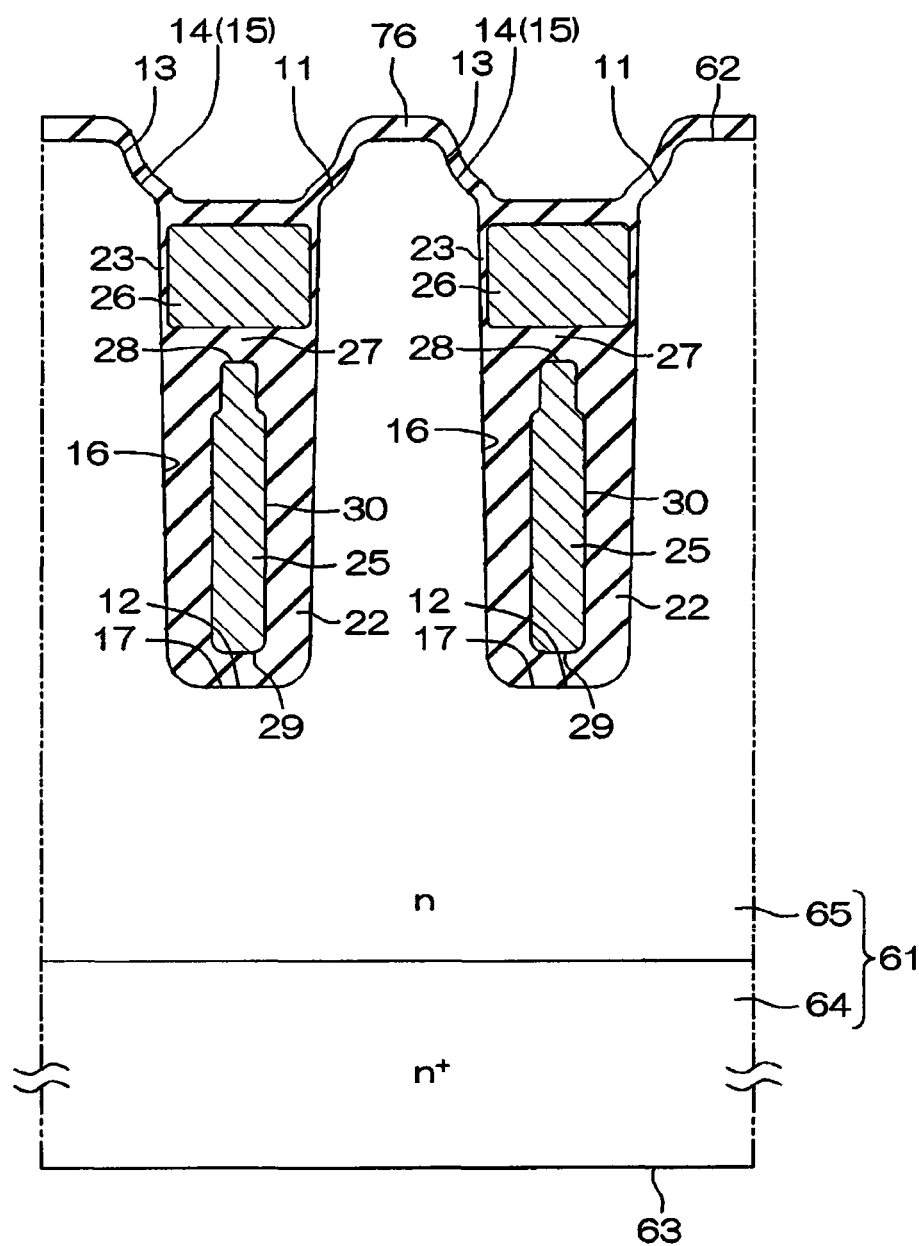
FIG. 6M is a cross-sectional view showing a step after FIG. 6L.
Figure 6N:
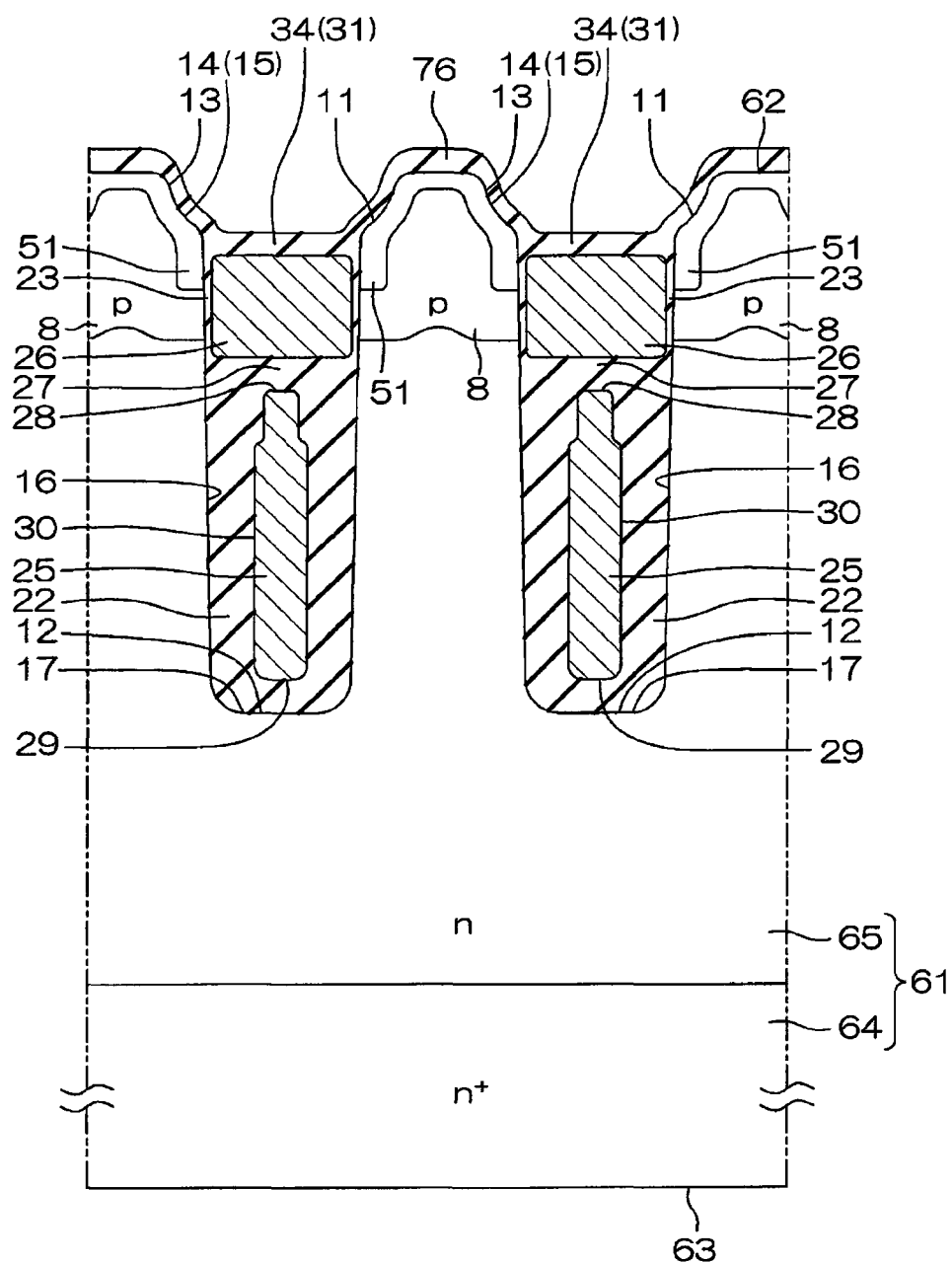
FIG. 6N is a cross-sectional view showing a step after FIG. 6M.
Figure 6O:
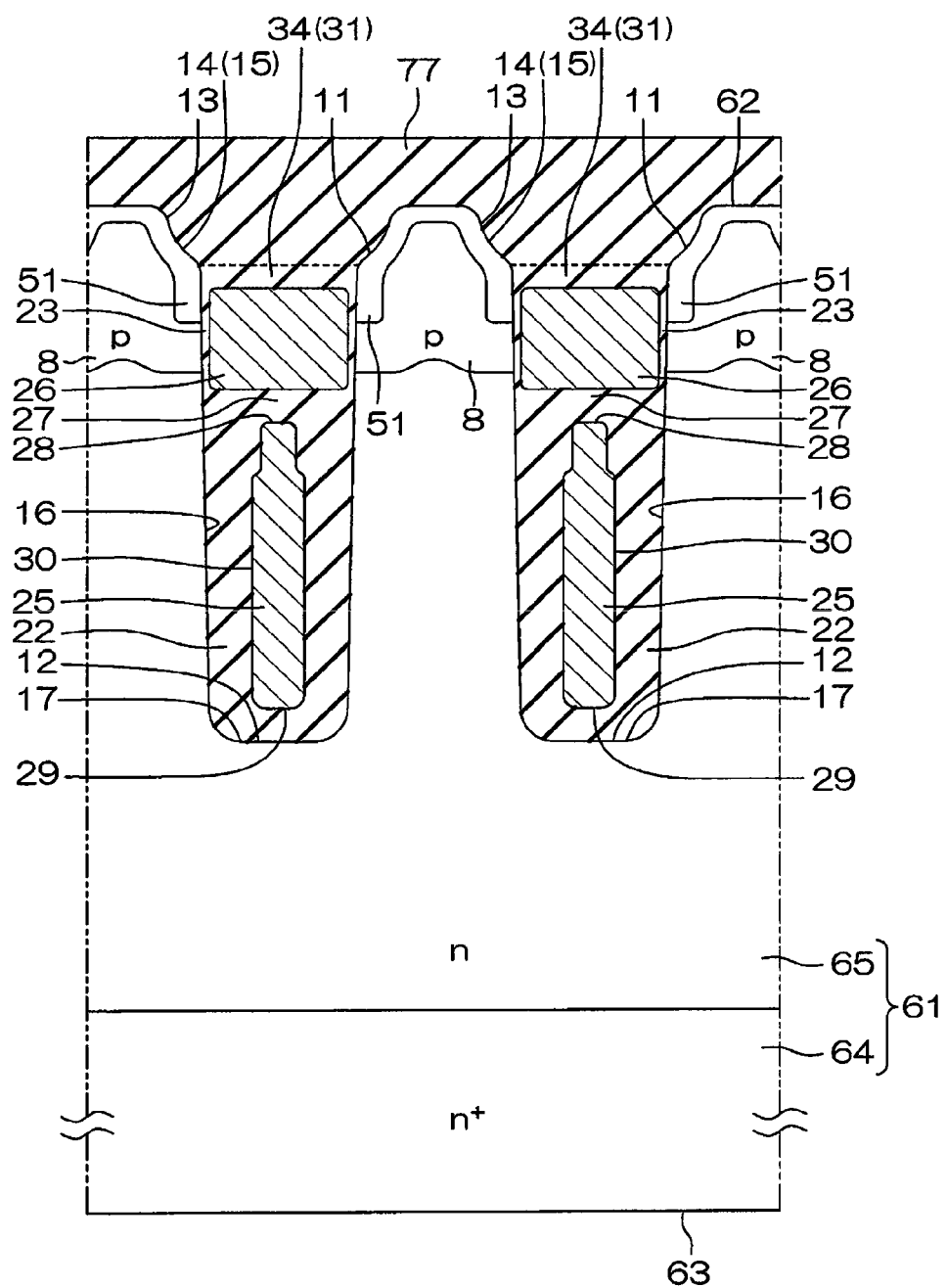
FIG. 6O is a cross-sectional view showing a step after FIG. 6N.
Figure 6P:
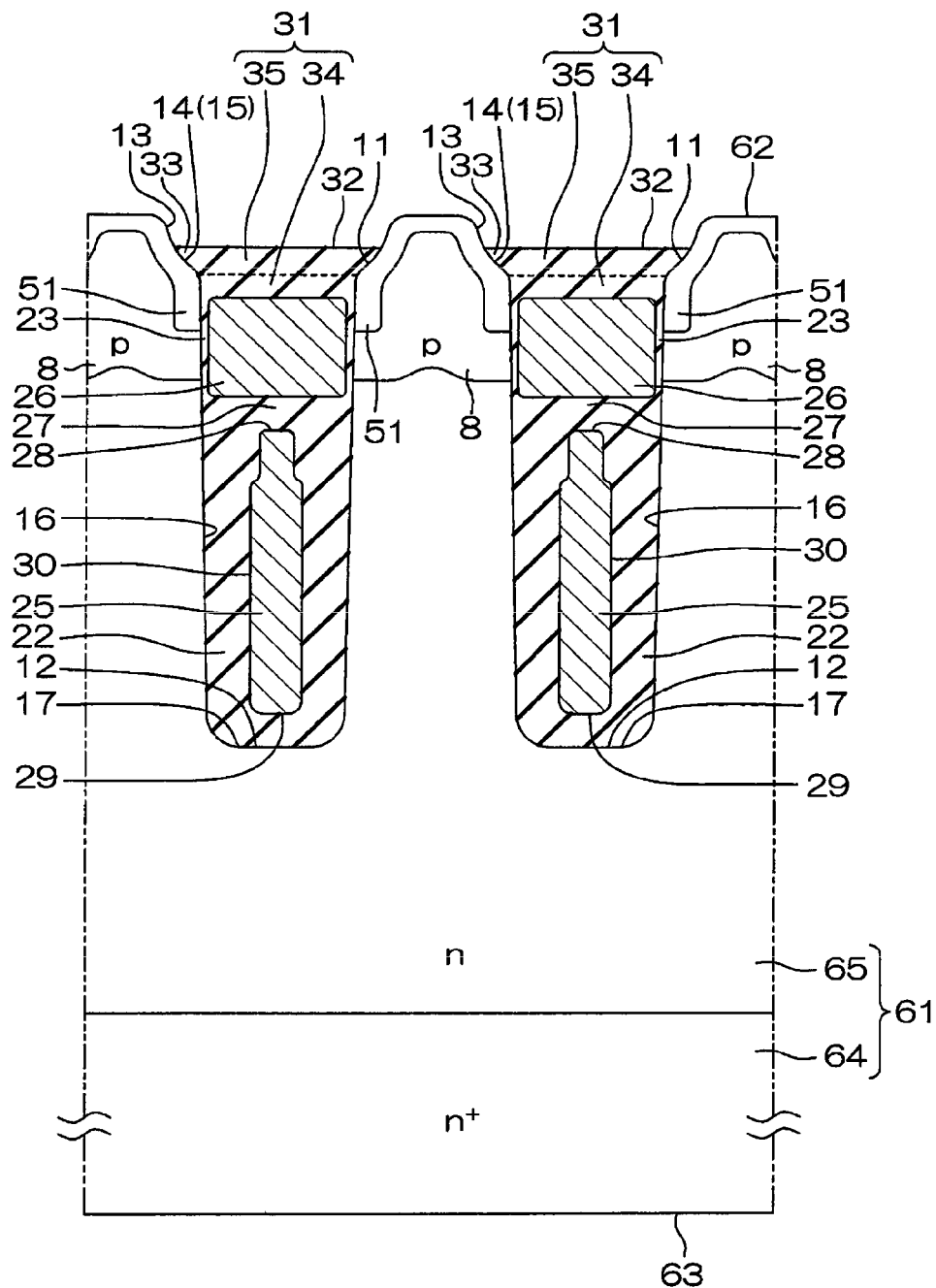
FIG. 6P is a cross-sectional view showing a step after FIG. 6O.
Figure 6Q:
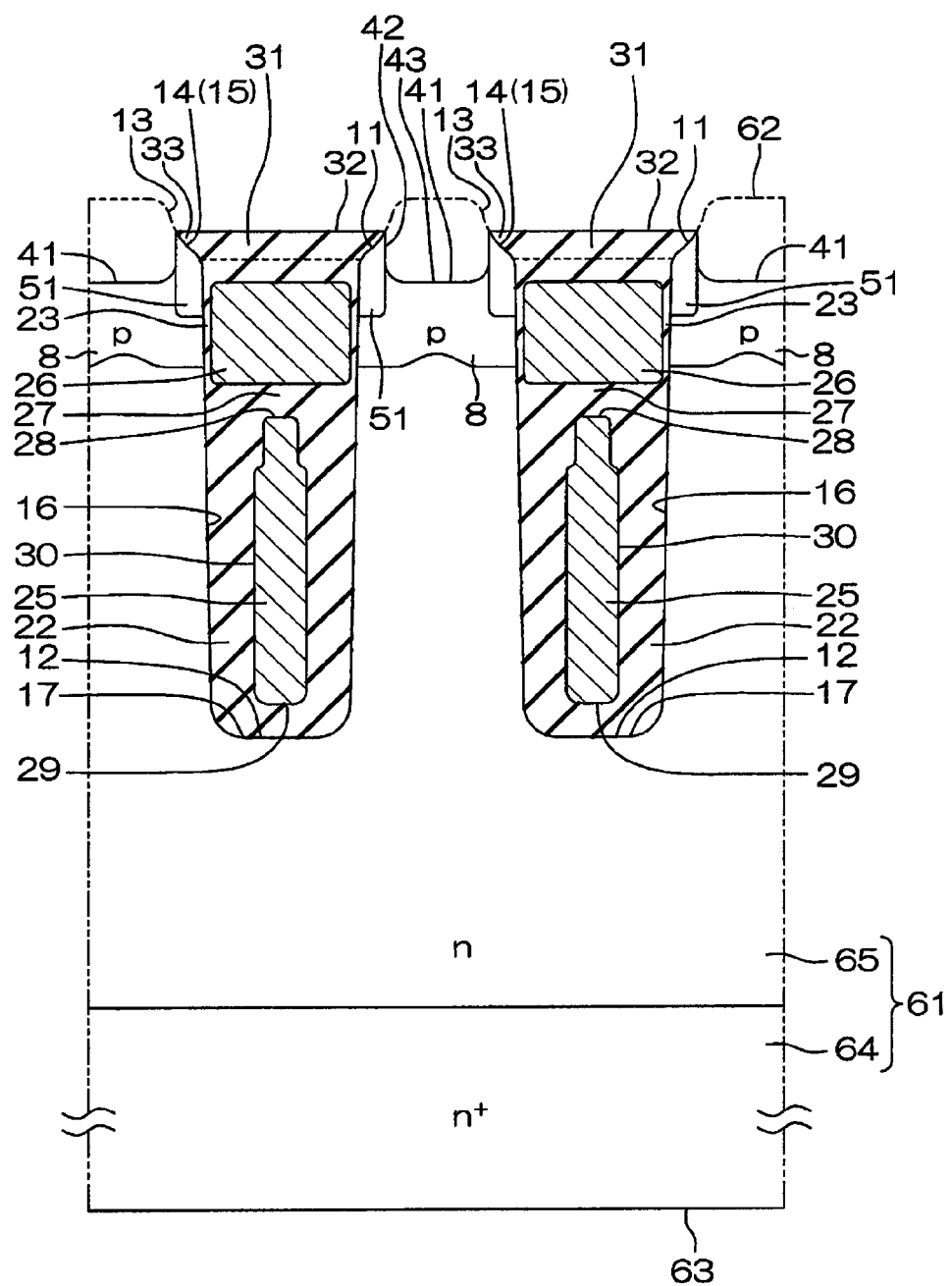
FIG. 6Q is a cross-sectional view showing a step after FIG. 6P.
Figure 6R:
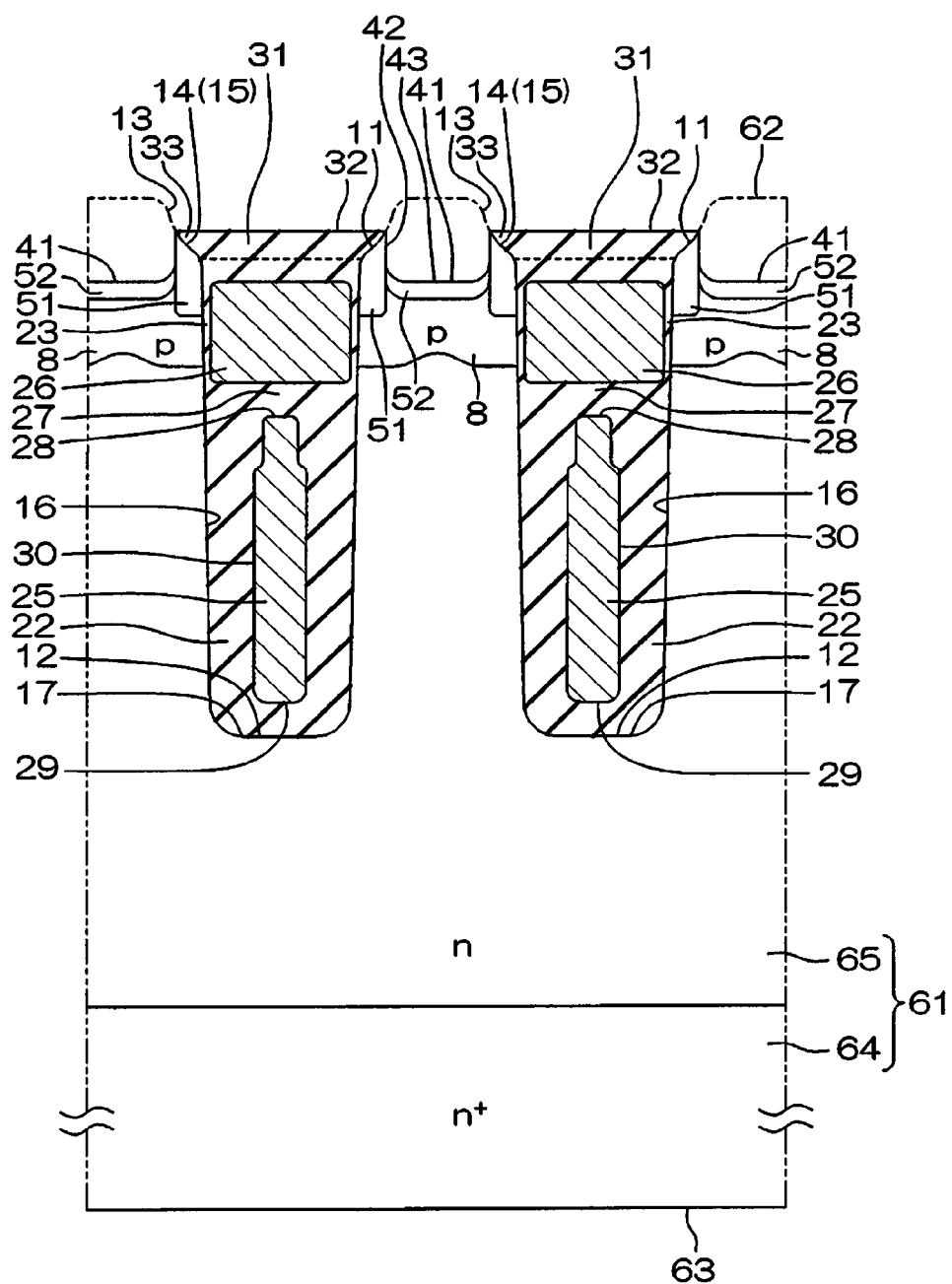
FIG. 6R is a cross-sectional view showing a step after FIG. 6Q.
Figure 6S:
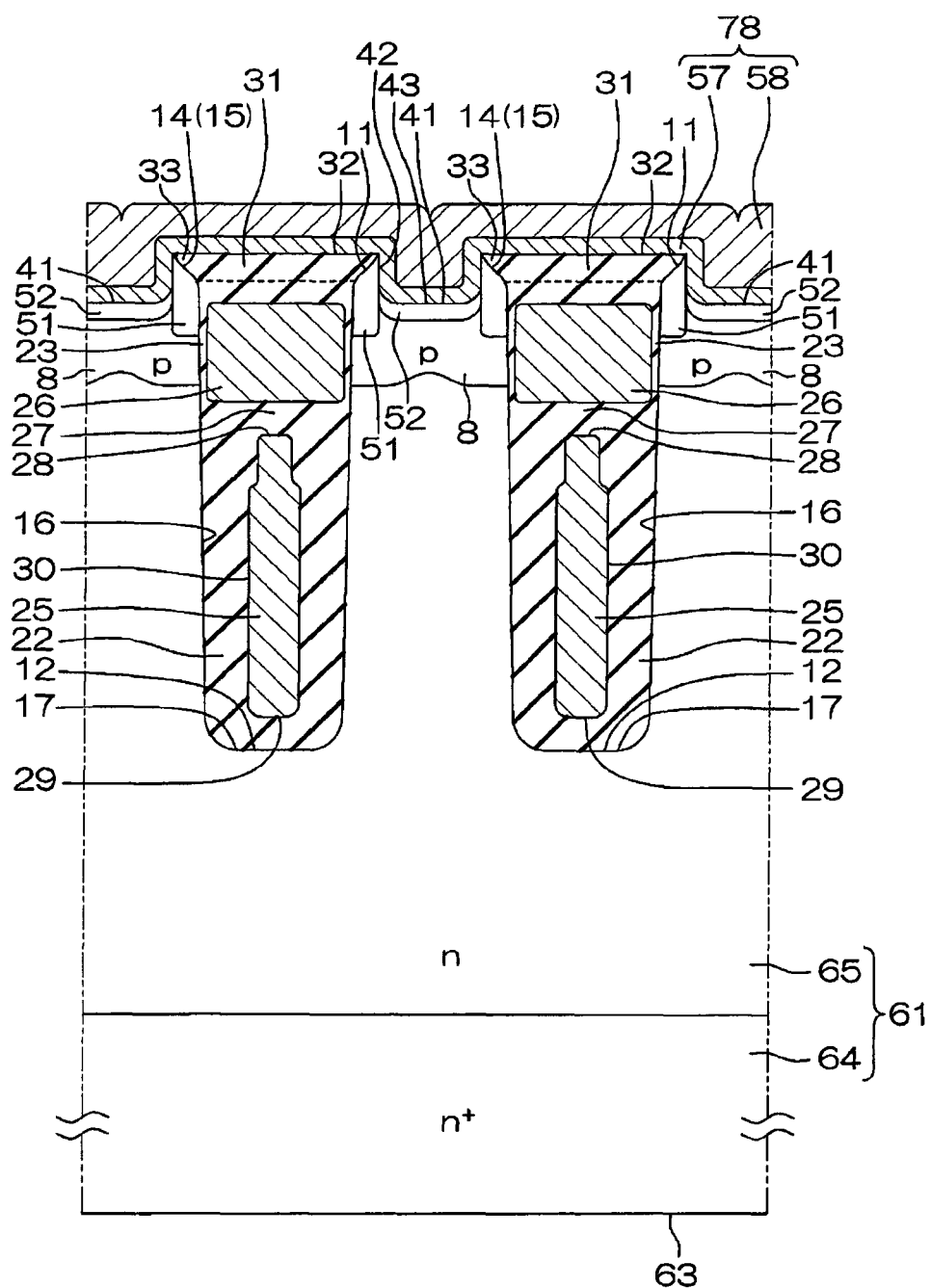
FIG. 6S is a cross-sectional view showing a step after FIG. 6R.
Figure 6T:
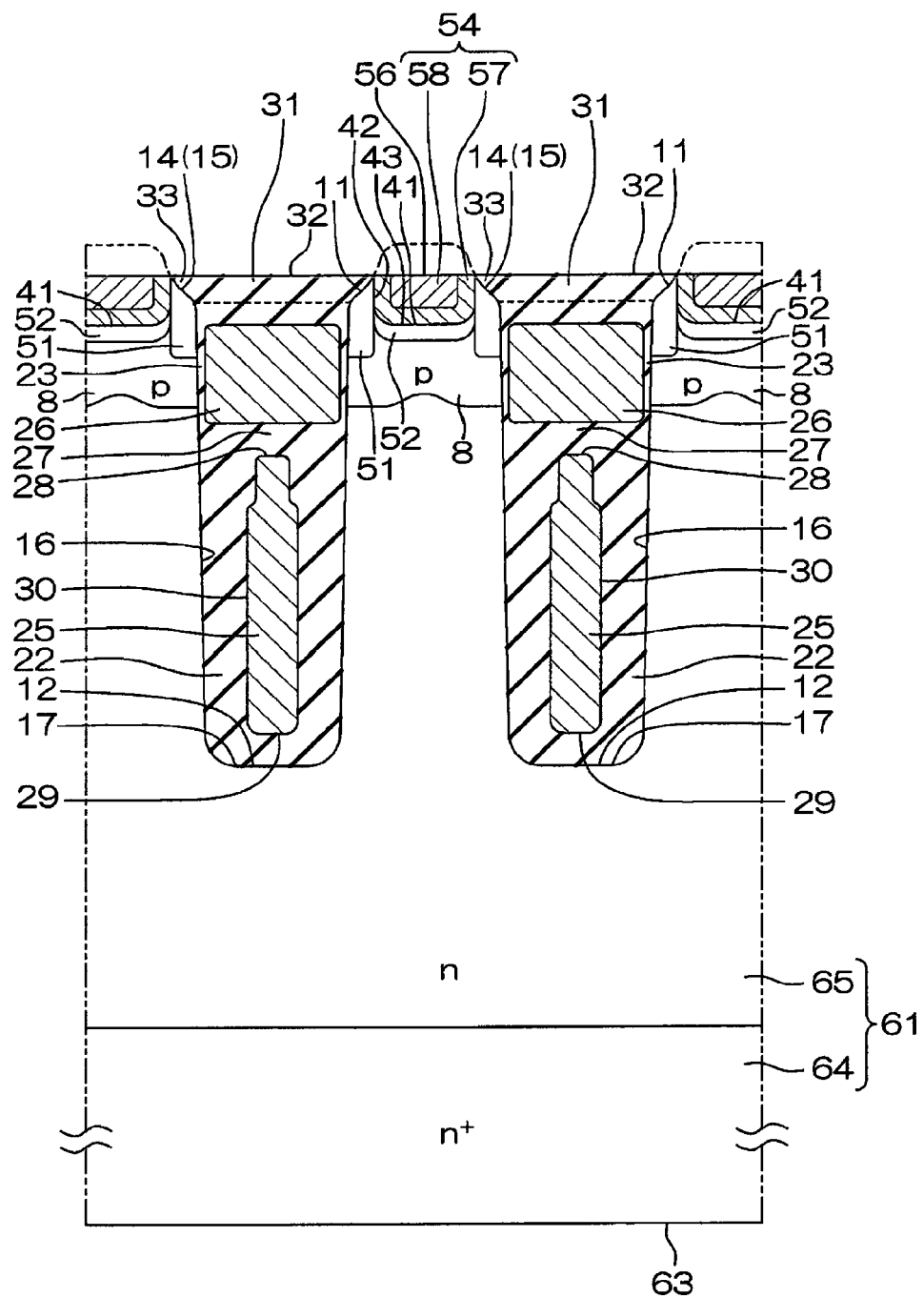
FIG. 6T is a cross-sectional view showing a step after FIG. 6S.
Figure 6U:
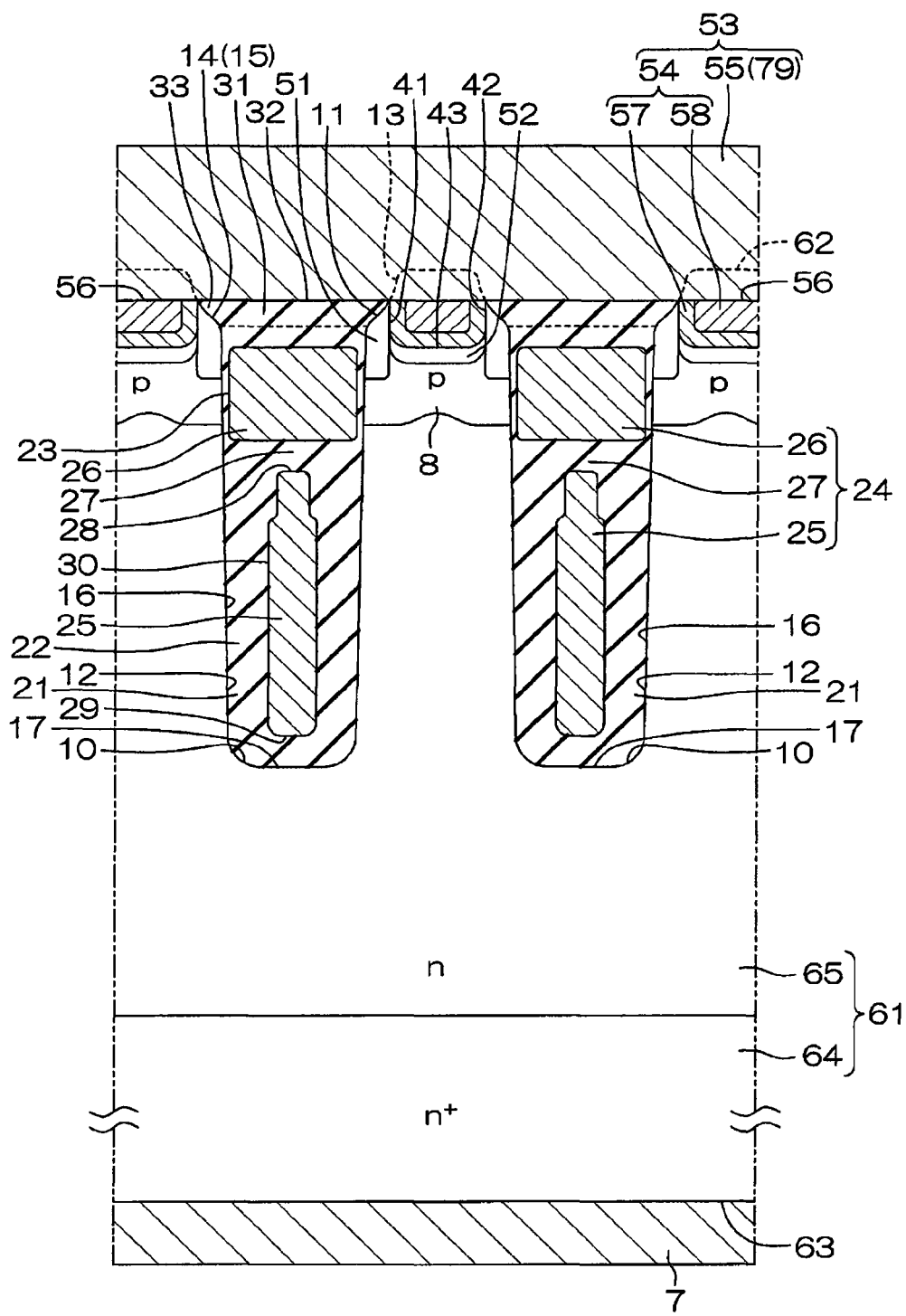
FIG. 6U is a cross-sectional view showing a step after FIG. 6T.

FIGS. 6A to 6U are cross-sectional views of a region corresponding to FIG. 1 for explaining an example of a method of manufacturing the semiconductor device 1 illustrated in FIG. 1.

Referring to FIG. 6A, a silicon semiconductor wafer layer 61 serving as a base of the semiconductor layer 2 is prepared. The semiconductor wafer layer 61 includes a first wafer main surface 62 and a second wafer main surface 63. The first wafer main surface 62 and the second wafer main surface 63 of the semiconductor wafer layer 61 correspond to the first main surface 3 and the second main surface 4 of the semiconductor layer 2, respectively.

The semiconductor wafer layer 61 is manufactured through a step of forming an n-type epitaxial layer 65 on the main surface of an n+-type semiconductor wafer 64. The epitaxial layer 65 is formed by epitaxially growing silicon from the main surface of the semiconductor wafer 64. The drain region 6 is formed by the semiconductor wafer 64, and the drift region 5 is formed by the epitaxial layer 65.

Next, the first trench portion 11 is formed in the first wafer main surface 62. In this step, an insulating first hard mask 66 having a predetermined pattern is first formed on the first wafer main surface 62. The first hard mask 66 includes an opening 67 for exposing a region where the first trench portion 11 is to be formed in the first wafer main surface 62.

The first hard mask 66 may be formed by a CVD (Chemical Vapor Deposition) method or an oxidation method (for example, a thermal oxidation method). The opening 67 of the first hard mask 66 may be formed by an etching method via a resist mask (not shown).

Next, unnecessary portions of the semiconductor wafer layer 61 are removed by an etching method via the first hard mask 66. The etching method may be a wet etching method and/or a dry etching method. As a result, the first trench portion 11 is formed in the first wafer main surface 62.

Next, referring to FIG. 6B, an insulating second hard mask 68 is formed on the first wafer main surface 62. The second hard mask 68 is formed in a film shape along the first hard mask 66 and the inner wall of the first trench portion 11. The second hard mask 68 may be formed by a CVD method and/or an oxidation method (for example, a thermal oxidation method).

Next, referring to FIG. 6C, unnecessary portions of the second hard mask 68 are removed by an etching method. The etching method is an anisotropic dry etching method. As a result, a portion of the second hard mask 68 remains as a side wall 68a on the first side wall 13 of the first trench portion 11. That is, the side wall 68a is formed in a self-aligned manner on the first side wall 13 of the first trench portion 11. The side wall 68a defines an opening 69 in the first trench portion 11. The opening 69 defined by the side wall 68a has an opening width smaller than the opening width of the opening 67 of the first hard mask 66.

Next, unnecessary portions of the semiconductor wafer layer 61 are removed by an etching method via the first hard mask 66 and the second hard mask 68. As a result, the second trench portion 12 is formed at the first bottom wall 14 of the first trench portion 11. The second trench portion 12 forms one trench 10 with the first trench portion 11. After that, the first hard mask 66 and the second hard mask 68 are removed.

Next, referring to FIG. 6D, a first base insulating layer 70 serving as a base of the bottom side insulating layer 22 of the insulating layer 21 is formed. The first base insulating layer 70 is formed in a film shape along the first wafer main surface 62, the inner wall of the first trench portion 11, and the inner wall of the second trench portion 12. The first base insulating layer 70 may be formed by an oxidation method or a CVD method. In this embodiment, the first base insulating layer 70 is formed by a thermal oxidation method.

In this process, a corner connecting the first side wall 13 of the first trench portion 11 and the first wafer main surface 62 is rounded by oxidation. Further, a corner connecting the first side wall 13 and the first bottom wall 14 of the first trench portion 11 is rounded by oxidation. In addition, a corner connecting the first bottom wall 14 of the first trench portion 11 and the second side wall 16 of the second trench portion 12 is rounded by oxidation. Further, a corner connecting the second side wall 16 and the second bottom wall 17 of the second trench portion 12 is rounded by oxidation.

Next, referring to FIG. 6E, a first base electrode layer 71 serving as a base of the bottom side electrode 25 of the buried electrode 24 is formed on the first wafer main surface 62. The first base electrode layer 71 fills the first trench portion 11 and the second trench portion 12, and covers the first wafer main surface 62. The first base electrode layer 71 contains conductive polysilicon. The first base electrode layer 71 may be formed by a CVD method.

Next, referring to FIG. 6F, unnecessary portions of the first base electrode layer 71 are removed. The unnecessary portions of the first base electrode layer 71 may be removed by an etching method (etch-back method). The etching method may be a wet etching method and/or a dry etching method. The first base electrode layer 71 is removed until an etched surface (the upper end portion 28) is located in the middle of the second trench portion 12 in the depth direction. Thus, the bottom side electrode 25 of the buried electrode 24 is formed.

Next, referring to FIG. 6G, unnecessary portions of the first base insulating layer 70 are removed. The unnecessary portions of the first base insulating layer 70 may be removed by an etching method (etch-back method) via a resist mask (not shown) having a predetermined pattern. The etching method may be a wet etching method and/or a dry etching method. The first base insulating layer 70 is removed until the upper end portion 28 (a portion of the wall portion 30) of the bottom side electrode 25 is exposed. Thus, the bottom side insulating layer 22 of the insulating layer 21 is formed.

Next, referring to FIG. 6H, a second base insulating layer 73 serving as a base of the intermediate insulating layer 27 is formed. The second base insulating layer 73 fills the first trench portion 11 and the second trench portion 12, and covers the first wafer main surface 62. The second base insulating layer 73 may be formed by an oxidation method (for example, a thermal oxidation method) and/or a CVD method. In this embodiment, the second base insulating layer 73 is formed by a CVD method.

Next, referring to FIG. 6I, unnecessary portions of the second base insulating layer 73 are removed. The unnecessary portions of the second base insulating layer 73 may be removed by an etching method (etch-back method) via a resist mask (not shown) having a predetermined pattern. The etching method may be a wet etching method and/or a dry etching method. Thus, the intermediate insulating layer 27 covering the bottom side electrode 25 in the second trench portion 12 is formed. The intermediate insulating layer 27 defines a recess space between the intermediate insulating layer 27 and the second side wall 16 of the second trench portion 12.

Next, referring to FIG. 6J, a third base insulating layer 74 serving as a base of the opening side insulating layer 23 of the insulating layer 21 is formed. The third base insulating layer 74 covers the second side wall 16 of the second trench portion 12 and the first wafer main surface 62. The third base insulating layer 74 may be formed by an oxidation method (for example, a thermal oxidation method) or a CVD method. In this embodiment, the third base insulating layer 74 is formed by a thermal oxidation method.

Next, referring to FIG. 6K, a second base electrode layer 75 serving as a base of the opening side electrode 26 of the buried electrode 24 is formed on the first wafer main surface 62. The second base electrode layer 75 fills the second trench portion 12 and covers the first wafer main surface 62. The second base electrode layer 75 contains conductive polysilicon. The second base electrode layer 75 may be formed by a CVD method.

Next, referring to FIG. 6L, unnecessary portions of the second base electrode layer 75 are removed. The unnecessary portions of the second base electrode layer 75 may be removed by an etching method (etch-back method) via a resist mask (not shown) having a predetermined pattern. The etching method may be a wet etching method and/or a dry etching method. The second base electrode layer 75 is removed until the first bottom wall 14 of the first trench portion 11 is exposed. In this embodiment, the second base electrode layer 75 is removed until the second side wall 16 of the second trench portion 12 is exposed.

Next, referring to FIG. 6M, a fourth base insulating layer 76 serving as a base of a portion (the first region 34) of the insulator 31 is formed. The fourth base insulating layer 76 fills the first trench portion 11 and the second trench portion 12 and covers the first wafer main surface 62. The fourth base insulating layer 76 covers the opening side electrode 26 in the second trench portion 12. The fourth base insulating layer 76 may be formed by an oxidation method (for example, a thermal oxidation method) or a CVD method. In this embodiment, the fourth base insulating layer 76 is formed by a CVD method.

Next, referring to FIG. 6N, the body region 8 is formed in the surface layer of the first wafer main surface 62. The body region 8 is formed by introducing p-type impurities into the surface layer of the first wafer main surface 62 by an ion implantation method via an ion implantation mask (not shown). More specifically, the p-type impurities of the body region 8 are introduced from the first wafer main surface 62 and the first side wall 13 of the first trench portion 11 into the surface layer of the first wafer main surface 62.

In addition, the source region 51 is formed in the surface layer of the first wafer main surface 62. The source region 51 is formed by introducing n-type impurities into the surface layer of the first wafer main surface 62 by an ion implantation method via an ion implantation mask (not shown). More specifically, the n-type impurities of the source region 51 are introduced from the first wafer main surface 62 and the first side wall 13 of the first trench portion 11 into the surface layer of the first wafer main surface 62.

The order of the process of forming the body region 8 and the process of forming the source region 51 is optional. The process of forming the source region 51 may be performed after the process of forming the body region 8. The process of forming the body region 8 may be performed after the process of forming the source region 51.

A portion of the fourth base insulating layer 76 that becomes the first region 34 of the insulator 31 may contain the same type of p-type impurities as the p-type impurities of the body region 8. The portion of the fourth base insulating layer 76 that becomes the first region 34 of the insulator 31 may contain the same type of n-type impurities as the n-type impurities of the source region 51.

Next, referring to FIG. 6O, a fifth base insulating layer 77 serving as a base of a portion (the second region 35) of the insulator 31 is formed. The fifth base insulating layer 77 fills the first trench portion 11 and covers the first wafer main surface 62. The fifth base insulating layer 77 covers the first region 34 of the insulator 31 in the first trench portion 11. The fifth base insulating layer 77 may be formed by an oxidation method (for example, a thermal oxidation method) and/or a CVD method. In this embodiment, the fifth base insulating layer 77 is formed by a CVD method.

Next, referring to FIG. 6P, unnecessary portions of the fifth base insulating layer 77 are removed. The unnecessary portions of the fifth base insulating layer 77 are portions of the fifth base insulating layer 77 exposed from the first trench portion 11. The unnecessary portions of the fifth base insulating layer 77 may be removed by an etching method via a resist mask (not shown) having a predetermined pattern.

The etching method may be a wet etching method and/or a dry etching method. The fifth base insulating layer 77 is removed until the first side wall 13 of the first trench portion 11 is exposed. Thus, the insulator 31 including the first region 34 in the second trench portion 12 and the second region 35 in the first trench portion 11 is formed.

Next, referring to FIG. 6Q, a plurality of contact holes 41 are formed in the first wafer main surface 62. The contact holes 41 are formed by removing unnecessary portions of the semiconductor wafer layer 61. The unnecessary portions of the semiconductor wafer layer 61 may be removed by an etching method via a resist mask (not shown) having a predetermined pattern.

The resist mask may be formed on the first wafer main surface 62 so as to expose the plurality of trenches 10 (the insulators 31) at the same time and cover the other regions. The etching method may be a wet etching method and/or a dry etching method. As a result, portions of the first wafer main surface 62 exposed from the plurality of insulators 31 are removed.

The plurality of contact holes 41 are formed in a self-aligned manner with respect to the plurality of insulators 31. The region between the plurality of insulators 31 in the first wafer main surface 62 is not affected by an alignment error of the resist mask. As a result, the displacement of the contact holes 41 can be appropriately suppressed.

Next, referring to FIG. 6R, the contact regions 52 are formed at the contact bottom walls 43 of the plurality of contact holes 41. The contact regions 52 are formed by introducing p-type impurities into the contact bottom walls 43 by an ion implantation method via an ion implantation mask (not shown).

Next, referring to FIG. 6S, a third base electrode layer 78 serving as a base of a portion (the first electrode portion 54) of the source electrode 53 is formed on the first wafer main surface 62. The process of forming the third base electrode layer 78 includes a process of forming the first layer 57 and the second layer 58 in this order from the first wafer main surface 62 side.

The first layer 57 is formed in a film shape along the inner wall of the contact hole 41 and the exposed surface 32 of the insulator 31. The second layer 58 is formed in a film shape along the first layer 57. The first layer 57 and the second layer 58 may be formed by a sputtering method and/or a CVD method.

Next, referring to FIG. 6T, unnecessary portions of the third base electrode layer 78 are removed. The unnecessary portions of the third base electrode layer 78 may be removed by an etching method (etch-back method). The etching method may be a wet etching method and/or a dry etching method. The unnecessary portions of the third base electrode layer 78 are removed until the exposed surface 32 of the insulator 31 is exposed. Thus, the first electrode portion 54 is formed in the contact hole 41.

Next, referring to FIG. 6U, a fourth base electrode layer 79 serving as a base of a portion (the second electrode portion 55) of the source electrode 53 is formed on the first wafer main surface 62. The fourth base electrode layer 79 may be formed by a sputtering method and/or a CVD method.

Next, unnecessary portions of the fourth base electrode layer 79 are removed. The unnecessary portions of the fourth base electrode layer 79 may be removed by an etching method via a resist mask (not shown) having a predetermined pattern. The etching method may be a wet etching method and/or a dry etching method. Thus, the second electrode portion 55 having a predetermined pattern is formed.

Next, the drain electrode 7 is formed on the second wafer main surface 63. The drain electrode 7 may be formed by a sputtering method. The step of forming the drain electrode 7 does not necessarily need to be performed at this time. The process of forming the drain electrode 7 is performed at an arbitrary time after the preparation of the semiconductor wafer layer 61 (see FIG. 6A). After that, the semiconductor wafer layer 61 is selectively cut, and the semiconductor device 1 is cut out. The semiconductor device 1 is manufactured via processes including the above-described processes.

Figure 7:
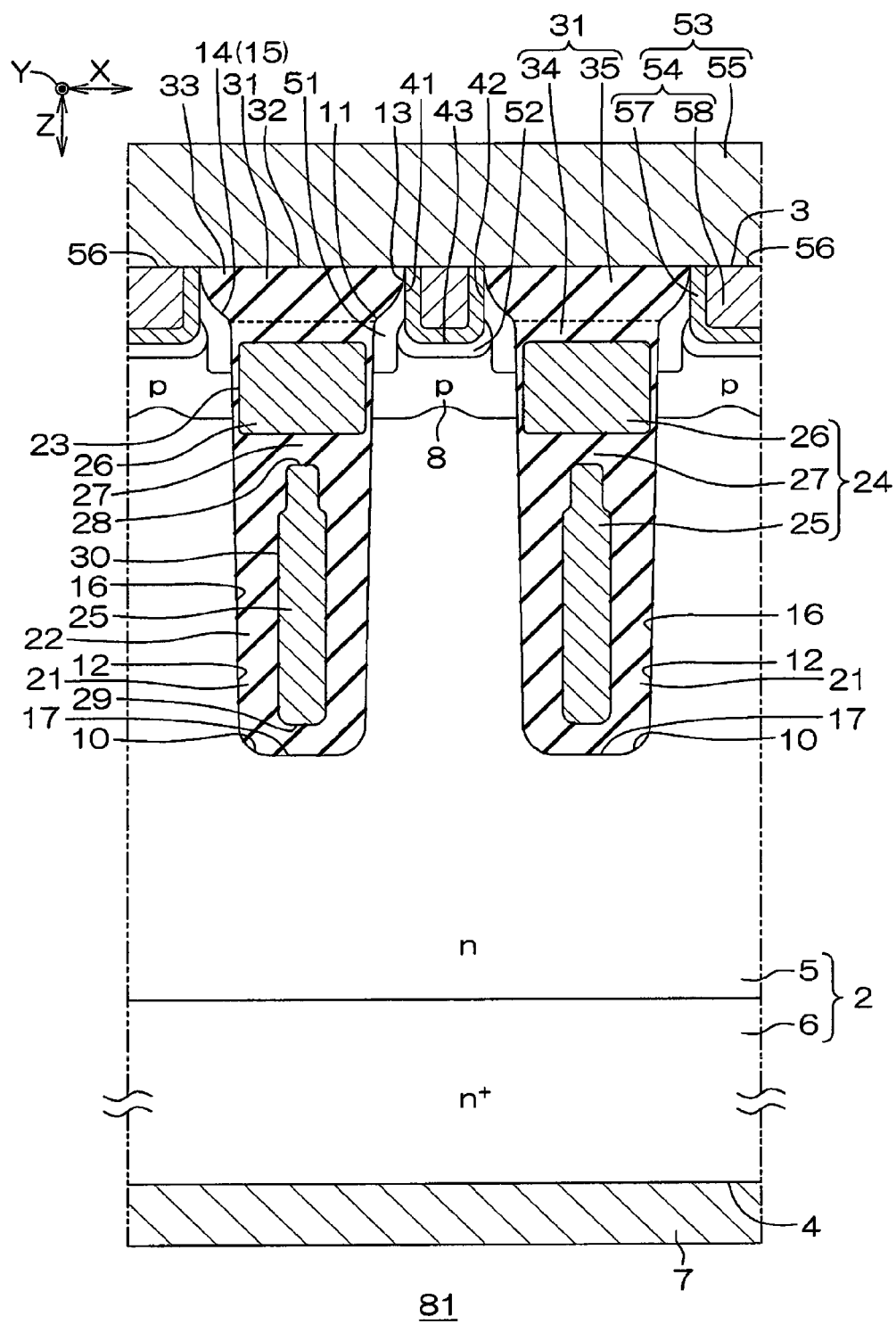
FIG. 7 is an enlarged cross-sectional view of a region corresponding to FIG. 1 and shows a partial region of a semiconductor device according to a second embodiment of the present disclosure.

FIG. 7 is an enlarged cross-sectional view of a region corresponding to FIG. 1 and shows a partial region of a semiconductor device 81 according to a second embodiment of the present disclosure. In the following description, structures corresponding to the structures described for the semiconductor device 1 are denoted by the same reference numerals, and explanation thereof will not be repeated.

The semiconductor device 81 is different from the semiconductor device 1 in that the exposed surface 32 of the insulator 31 and the electrode surface 56 of the first electrode portion 54 are located on the same plane as the first main surface 3 of the semiconductor layer 2. The contact hole 41 is formed by digging into the first main surface 3 of the semiconductor layer 2 toward the second main surface 4 thereof. The thickness of the second region 35 of the insulator 31 may exceed the thickness of the first region 34 of the insulator 31.

The semiconductor device 81 is formed by removing the fifth base insulating layer 77 until the first wafer main surface 62 of the semiconductor wafer layer 61 is exposed in the above-described process of removing the fifth base insulating layer 77 (see FIG. 6P).

As described above, the semiconductor device 81 can also achieve the same effects as those described for the semiconductor device 1.

Figure 8:
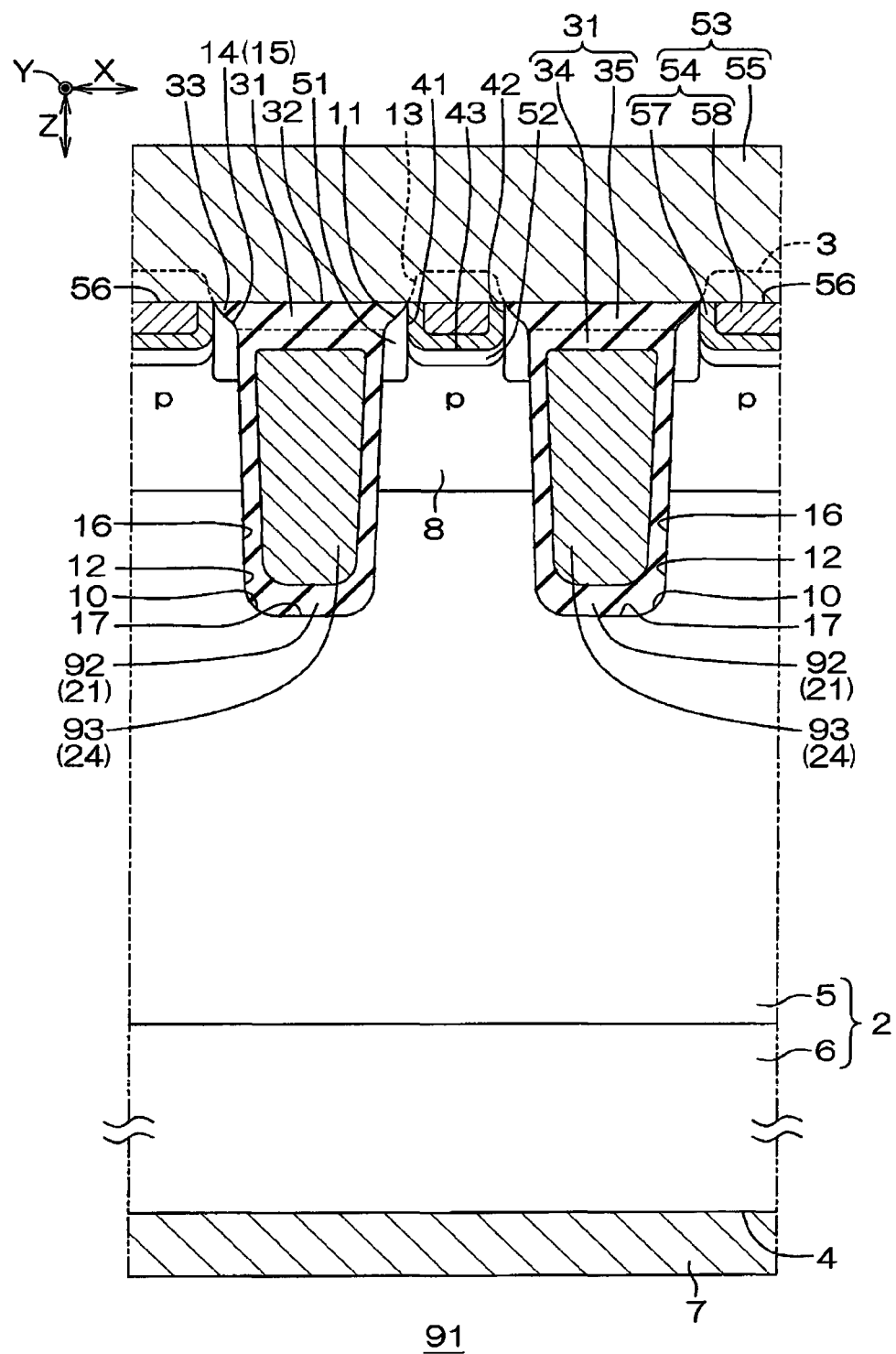
FIG. 8 is an enlarged cross-sectional view of a region corresponding to FIG. 1 and shows a partial region of a semiconductor device according to a third embodiment of the present disclosure.

FIG. 8 is an enlarged cross-sectional view of a region corresponding to FIG. 1 and shows a partial region of a semiconductor device 91 according to a third embodiment of the present disclosure. In the following description, structures corresponding to the structures described for the semiconductor device 1 are denoted by the same reference numerals, and explanation thereof will not be repeated.

In the semiconductor device 1, the insulating layer 21 includes the bottom side insulating layer 22 and the opening side insulating layer 23, and the buried electrode 24 includes the bottom side electrode 25, the opening side electrode 26, and the intermediate insulating layer 27. In contrast, in the semiconductor device 91, the insulating layer 21 does not include the bottom side insulating layer 22, and the buried electrode 24 does not include the bottom side electrode 25 and the intermediate insulating layer 27. In the semiconductor device 91, the insulating layer 21 includes a gate insulating layer 92 corresponding to the opening side insulating layer 23, and the buried electrode 24 includes a gate electrode 93 corresponding to the opening side electrode 26.

The gate insulating layer 92 is formed in a film shape along the inner wall of the second trench portion 12. The gate insulating layer 92 defines a recess space in the second trench portion 12. The gate insulating layer 92 may have a uniform thickness. The thickness of a portion of the gate insulating layer 92 that covers the second bottom wall 17 may exceed the thickness of a portion of the gate insulating layer 92 that covers the second side wall 16. The gate insulating layer 92 may have a uniform thickness.

The gate electrode 93 is buried in the second trench portion 12 as a single body with the gate insulating layer 92 interposed therebetween. More specifically, the gate electrode 93 is buried in a recess space defined by the gate insulating layer 92 in the second trench portion 12. A gate voltage is applied to the gate electrode 93.

The gate electrode 93 may contain at least one selected from the group of conductive polysilicon, tungsten, aluminum, copper, an aluminum alloy, and a copper alloy. In this embodiment, the gate electrode 93 contains conductive polysilicon. The gate electrode 93 may contain n-type polysilicon or p-type polysilicon.

As described above, the semiconductor device 91 can also achieve the same effects as those described for the semiconductor device 1.

Although the embodiments of the present disclosure have been described, the present disclosure can be implemented in other forms.

In each of the above embodiments, the p-type semiconductor portion may be an n-type semiconductor portion, and the n-type semiconductor portion may be a p-type semiconductor portion. In this case, in the above description of each embodiment, the "n-type" portion is replaced by "p-type," and the "p-type" portion is replaced by "n-type".

In each of the above embodiments, a p+-type collector region may be used instead of the n+-type drain region 6. According to this structure, it is possible to provide a semiconductor device including an IGBT (Insulated Gate Bipolar Transistor) as an example of an insulated gate type transistor instead of the MISFET.

In this case, in each of the above embodiments, the "source" of the MISFET is replaced with an "emitter" of the IGBT, and the "drain" of the MISFET is replaced with a "collector" of the IGBT. The semiconductor device including the IGBT can also achieve same effects as those described for the semiconductor device 1.

In each of the above embodiments described above, the example in which the semiconductor layer 2 is made of Si (silicon) has been described. However, in each of the above embodiments, the semiconductor layer 2 may be made of a wide band gap semiconductor. For example, in each of the above embodiments, the semiconductor layer 2 may be made of a group III-V semiconductor as an example of the wide band gap semiconductor, SiC (silicon carbide) or diamond. Examples of the group III-V semiconductor may include GaN, GaAs, InN, and the like.

The present disclosure does not limit any combinations of the features shown in the first to third embodiments. The first to third embodiments can be combined in any form and any mode between them. That is, the features shown in the first to third embodiments may be combined in any form and any mode.

In addition, various design changes can be made within the scope of the matters set forth in the claims.

According to the present disclosure in some embodiments, it is possible to limit a formation region of a contact hole to a region between a plurality of insulators. The region between the plurality of insulators in a semiconductor layer is not affected by an alignment error of a resist mask. As a result, it is possible to suppress displacement of the contact hole.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a semiconductor layer including a main surface;
a plurality of trenches formed in the main surface at intervals from each other and including a plurality of first trench portions and a plurality of second trench portions, respectively, each of the first trench portions having a first width and formed in the main surface, and each of the second trench portions having a second width smaller than the first width and formed in a bottom wall of each of the first trench portions;
an insulating layer formed in an inner wall of each of the second trench portions;
a first electrode buried in each of the second trench portions with the insulating layer interposed between the first electrode and each of the second trench portions;
an insulator buried in each of the first trench portions so as to cover the first electrode;
a body region of a first conductivity type formed as a single layer on a drift region of a second conductivity type that is different from the first conductivity type, at a region between the plurality of trenches in a surface layer of the main surface of the semiconductor layer;
a contact region of the first conductivity type formed as a single layer on an upper surface of the body region and at a region between each pair of adjacent first trench portions among the plurality of first trench portions;
a contact hole formed at a region between each pair of the adjacent first trench portions among the plurality of first trench portions, the contact hole formed by dry etching on the surface layer of the main surface of the semiconductor layer such that an entirety of a bottom wall of the contact hole is in contact with an upper surface of the contact region body region;
a second electrode buried in the contact hole such that the second electrode is electrically connected to the body region;
and
an impurity region of the second conductivity type formed at a region along the bottom wall of each of the first trench portions in the body region,
wherein the body region is formed to be interposed between an entire bottom portion of the contact region and the drift region,
wherein a center portion of the body region under the contact region is partially recessed such that a portion of the drift region protrudes therein,
wherein in a cross-sectional view, an upper portion of the impurity region is defined by a first boundary and a second boundary, the first boundary is in contact with the contact hole, and the second boundary is in contact with an adjacent first trench portion among the first trench portions,
wherein in the cross-sectional view, the first boundary of the impurity region is formed to extend along a direction perpendicular to the bottom wall of the contact hole,
wherein in the cross-sectional view, as the adjacent first trench portion becomes larger in width along the direction perpendicular to the bottom wall of the contact hole, the second boundary is formed to be inclined such that the upper portion of the impurity region between the first boundary and the second boundary decreases to be tapered in width,
wherein the first electrode has an insulation-isolated electrode structure, and the first electrode comprising:
a bottom side electrode buried at a bottom wall side of each of the second trench portions; and
an opening side electrode buried at an opening side of each of the second trench portions,
wherein the insulating layer comprises:
a bottom side insulating layer, interposed between the bottom side electrode and the bottom wall of each of the second trench portions, covering a region of the bottom wall of each of the second trench portions, and having a first thickness;
an opening side insulating layer, interposed between the opening side electrode and a side wall of each of the second trench portions, covering a region of the side wall of each of the second trench portions, and having a second thickness smaller than the first thickness; and
an intermediate insulating layer interposed between the bottom side electrode and the opening side electrode, and
wherein a height of a lower portion of the second electrode is equal to or higher than a height of an upper portion of the opening side electrode in the cross-sectional view.

2. The semiconductor device of claim 1, wherein the contact hole is arranged to be next to each of the first trench portions.

3. The semiconductor device of claim 1, wherein the contact hole has a width smaller than the first width.

4. The semiconductor device of claim 3, wherein the width of the contact hole is smaller than the second width.

5. The semiconductor device of claim 3, wherein a distance between the contact hole and one among the plurality of second trench portions, which is adjacent to the contact hole, is equal to or smaller than the width of the contact hole in the cross-sectional view.

6. The semiconductor device of claim 1, wherein the insulator includes an exposed surface exposed from each of the first trench portions.

7. The semiconductor device of claim 1, wherein the second electrode includes:
a portion covering the insulator; and
a portion buried in the contact hole.

8. The semiconductor device of claim 1, wherein the second electrode is electrically connected to the impurity region.

9. The semiconductor device of claim 1,
wherein the contact region has a first conductivity type impurity concentration exceeding a first conductivity type impurity concentration of the body region, and wherein the second electrode is electrically connected to the body region via the contact region.

10. The semiconductor device of claim 1, wherein a reference voltage or a gate voltage is applied to the bottom side electrode, and wherein the gate voltage is applied to the opening side electrode.

11. The semiconductor device of claim 1, wherein the first electrode is buried in each of the second trench portions as a single body.

12. A semiconductor device comprising:
a semiconductor layer including a main surface;
a plurality of trenches formed in the main surface at intervals from each other and including a plurality of first trench portions and a plurality of second trench portions, respectively, each of the first trench portions having a first width and formed in the main surface, and each of the second trench portions having a second width smaller than the first width and formed in a bottom wall of each of the first trench portions;
an insulating layer formed in an inner wall of each of the second trench portions;
a bottom side electrode buried at a bottom wall side of each of the second trench portions;
an opening side electrode buried at an opening side of each of the second trench portions;
an insulator buried in each of the first trench portions so as to cover the opening side electrode;
a body region of a first conductivity type formed as a single layer on a drift region of a second conductivity type that is different from the first conductivity type, at a region between the plurality of trenches in a surface layer of the main surface of the semiconductor layer;
a contact region of the first conductivity type formed as a single layer on an upper surface of the body region and at a region between each pair of adjacent first trench portions among the plurality of first trench portions;
a contact hole formed at a region between each pair of the adjacent first trench portions among the plurality of first trench portions, the contact hole formed by dry etching on the surface layer of the main surface of the semiconductor layer such that an entirety of a bottom wall of the contact hole is in contact with an upper surface of the contact region;
an electrode buried in the contact hole such that the electrode is electrically connected to the body region; and
an impurity region of the second conductivity type formed at a region along the bottom wall of each of the first trench portions in the body region,
wherein the body region is formed to be interposed between an entire bottom portion of the contact region and the drift region,
wherein a center portion of the body region under the contact region is partially recessed such that a portion of the drift region protrudes therein,
wherein in a cross-sectional view, an upper portion of the impurity region is defined by a first boundary and a second boundary, the first boundary is in contact with the contact hole, and the second boundary is in contact with an adjacent first trench portion among the first trench portions,
wherein in the cross-sectional view, the first boundary of the impurity region is formed to extend along a direction perpendicular to the bottom wall of the contact hole,
wherein in the cross-sectional view, as the adjacent first trench portion becomes larger in width along the direction perpendicular to the bottom wall of the contact hole, the second boundary is formed to be inclined such that the upper portion of the impurity region between the first boundary and the second boundary decreases to be tapered in width,
wherein the insulating layer includes:
a bottom side insulating layer interposed between the bottom side electrode and the bottom wall of each of the second trench portions, covering a region of the bottom wall of each of the second trench portions, and having a first thickness;
an opening side insulating layer interposed between the opening side electrode and a side wall of each of the second trench portions, covering a region of the side wall of each of the second trench portions, and having a second thickness smaller than the first thickness; and
an intermediate insulating layer interposed between the bottom side electrode and the opening side electrode, and
wherein a height of a lower portion of the electrode is equal to or higher than a height of an upper portion of the opening side electrode in the cross-sectional view.

13. The semiconductor device of claim 12, wherein the contact hole is arranged to be next to each of the first trench portions.

14. The semiconductor device of claim 12, wherein the electrode is electrically connected to the impurity region.

15. The semiconductor device of claim 12,
wherein the contact region has a first conductivity type impurity concentration exceeding a first conductivity type impurity concentration of the body region,
wherein the electrode is electrically connected to the body region via the contact region.

* * * * *